(12) United States Patent
Hashida et al.

(10) Patent No.: US 9,791,988 B2
(45) Date of Patent: Oct. 17, 2017

(54) ELECTRODES FOR A TOUCH SENSOR, TOUCH PANEL AND DISPLAY UNIT

(71) Applicant: Toppan Printing Co., Ltd., Taito-ku (JP)

(72) Inventors: Yasunori Hashida, Taito-ku (JP); Takahiro Harada, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 117 days.

(21) Appl. No.: 14/875,211

(22) Filed: Oct. 5, 2015

(65) Prior Publication Data
US 2016/0026298 A1 Jan. 28, 2016

Related U.S. Application Data

(63) Continuation of application No. PCT/JP2014/066539, filed on Jun. 23, 2014.

(30) Foreign Application Priority Data

Jul. 8, 2013 (JP) ................................. 2013-142398
Mar. 25, 2014 (JP) ................................. 2014-062549

(51) Int. Cl.
*G06F 3/041* (2006.01)
*G06F 3/044* (2006.01)
(Continued)

(52) U.S. Cl.
CPC ............... *G06F 3/044* (2013.01); *G06F 1/16* (2013.01); *G06F 3/0412* (2013.01);
(Continued)

(58) Field of Classification Search
CPC .. H05K 1/02; H03K 17/96; G06F 1/16; G06F 3/044; G06F 3/041; G06F 3/045; G06F 3/038; G09G 5/00
See application file for complete search history.

(56) References Cited

U.S. PATENT DOCUMENTS 9,052,766 B2 * 6/2015 Dunphy ................ G06F 3/0412
9,575,609 B2 * 2/2017 Kurasawa ............... G06F 3/044
(Continued)

FOREIGN PATENT DOCUMENTS

JP 2010-39537 A 2/2010
JP 2012-73783 A 4/2012
(Continued)

OTHER PUBLICATIONS

Office Action dated Nov. 10, 2015 in Japanese Patent Application No. 2014-062549 (with English language translation).
(Continued)

*Primary Examiner* — Pegeman Karimi
(74) *Attorney, Agent, or Firm* — Oblon, McClelland, Maier & Neustadt, L.L.P.

(57) ABSTRACT

An electrode for a touch sensor, including strip electrodes arranged in an arrangement direction with a space therebetween, wherein each of the strip electrodes is made of a group of electrode wires spaced from one another and formed such that a total area of the electrode wires in each of the strip electrodes is the same, the strip electrodes include an end strip electrode and a non-end strip electrode, the end strip electrode being located in at least one end portion in the arrangement direction, and the strip electrodes are formed such that the end strip electrode has an area ratio different from an area ratio of the non-end strip electrode, where the area ratio of each of the strip electrodes is defined as a ratio of the total area of the electrode wires in each of the strip electrodes to an area of each of the strip electrodes.

15 Claims, 11 Drawing Sheets

(51) Int. Cl.
    *G06F 1/16*     (2006.01)
    *H05K 1/02*     (2006.01)

(52) U.S. Cl.
    CPC ......... *G06F 3/0416* (2013.01); *H05K 1/0296* (2013.01); *G06F 2203/04111* (2013.01); *G06F 2203/04112* (2013.01)

(56) References Cited

U.S. PATENT DOCUMENTS

| | | | |
|---|---|---|---|
| 2010/0026664 A1* | 2/2010 | Geaghan | G06F 3/044 345/174 |
| 2011/0102361 A1* | 5/2011 | Philipp | G06F 3/044 345/174 |
| 2011/0102370 A1* | 5/2011 | Kono | G06F 3/044 345/174 |
| 2013/0093721 A1 | 4/2013 | Nakamura et al. | |
| 2014/0360856 A1* | 12/2014 | Mizumoto | G06F 3/044 200/600 |

FOREIGN PATENT DOCUMENTS

| | | |
|---|---|---|
| JP | 2012-79238 A | 4/2012 |
| JP | 2013-84166 A | 5/2013 |
| JP | 2013-120590 A | 6/2013 |
| WO | WO 2013/039050 A1 | 3/2013 |

OTHER PUBLICATIONS

International Search Report dated Sep. 16, 2014 in PCT/JP2014/066539, filed Jun. 23, 2014.

\* cited by examiner

ELECTRODES FOR A TOUCH SENSOR, TOUCH PANEL AND DISPLAY UNIT

CROSS-REFERENCE TO RELATED APPLICATIONS

The present application is a continuation of International Application No. PCT/JP2014/066539, filed Jun. 23, 2014, which is based upon and claims the benefits of priority to Japanese Application No. 2013-142398, filed Jul. 8, 2013, and Japanese Application No. 2014-062549, filed Mar. 25, 2014. The entire contents of all of the above applications are incorporated herein by reference.

BACKGROUND OF THE INVENTION

Field of the Invention

This disclosure related to electrodes for a touch sensor having a plurality of electrodes arranged along one direction, a touch panel having the electrodes for a touch sensor, and a display unit.

Discussion of the Background

A touch sensor provided in a display unit has a drive electrode and a sensing electrode, which are examples of electrodes for a touch sensor, and detects contact of a finger or the like on an operation surface as a change in an electrical capacitance between the drive electrode and the sensing electrode. Images which a display panel forms are output to the operation surface through the drive electrode and the sensing electrode. Accordingly, the drive electrode and the sensing electrode are formed as, for example, groups of many electrode wires arranged with spaces between each other (for example, see PTL1).

PTL1: Japanese Patent Application Publication No. 2012-79238

SUMMARY OF THE INVENTION

According to one aspect of the present invention, an electrode for a touch sensor, including strip electrodes arranged in an arrangement direction with a space therebetween, wherein each of the strip electrodes is made of a group of electrode wires spaced from one another and formed such that a total area of the electrode wires in each of the strip electrodes is the same, the strip electrodes include an end strip electrode and a non-end strip electrode, the end strip electrode being located in at least one end portion in the arrangement direction, and the strip electrodes are formed such that the end strip electrode has an area ratio different from an area ratio of the non-end strip electrode, where the area ratio of each of the strip electrodes is defined as a ratio of the total area of the electrode wires in each of the strip electrodes to an area of each of the strip electrodes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

With reference to the drawings, hereinafter will be described embodiments of the present invention. In the following explanations, regarding functions and elements which are identical or substantially identical, the same reference numbers are applied and explained as necessary.

First Embodiment

With reference to FIGS. 1 to 8, here is an embodiment where described electrodes for a touch sensor of this disclosure, a touch panel and a display unit are embodied. Firstly, a configuration of the display unit is described with reference to FIG. 1.

Figure 1:
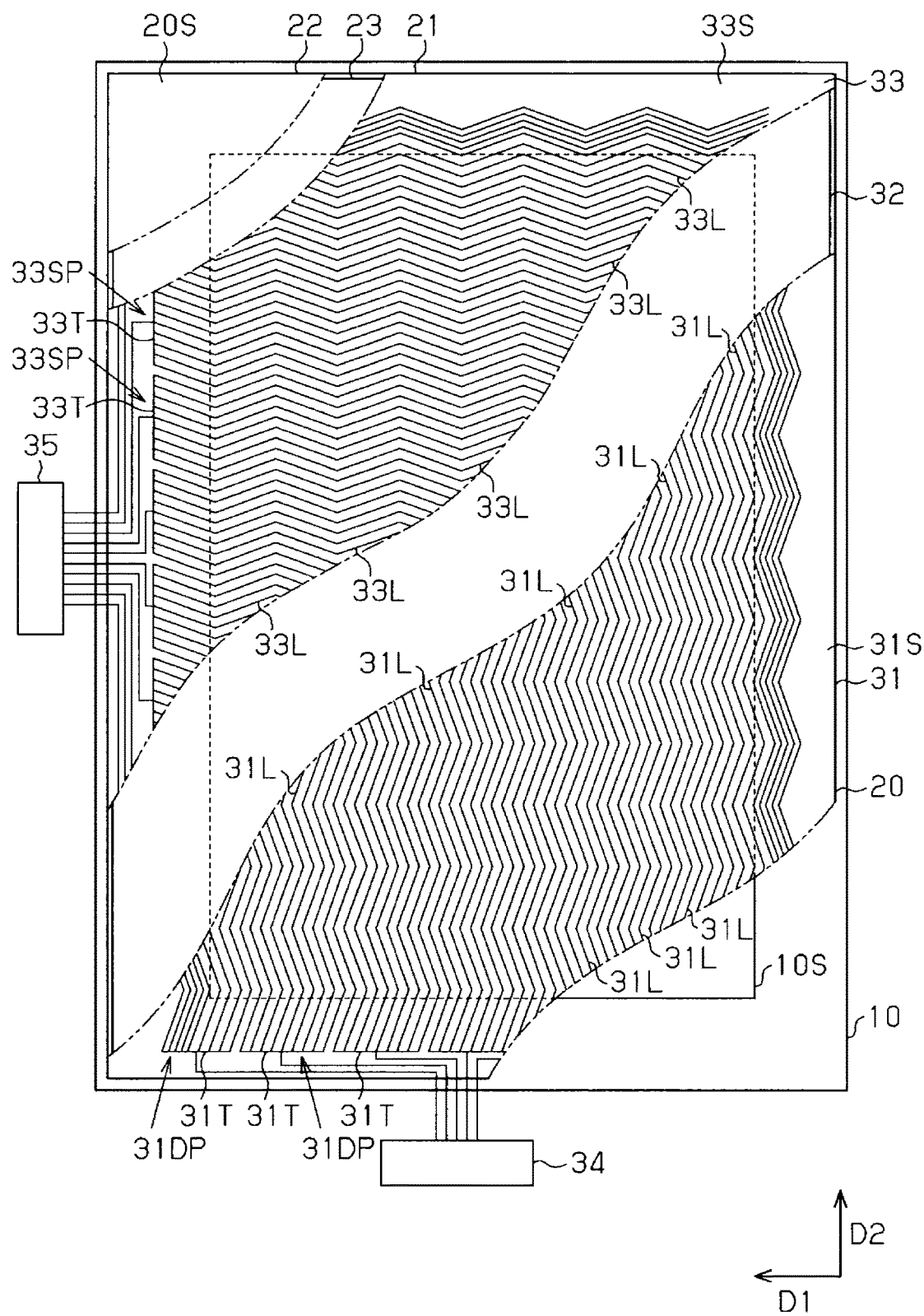
FIG. 1 is a plan view showing a display in a first embodiment, and a view where a part of constituent elements overlapping each other is cut out in order of overlapping and shown.

It should be noted that, for convenience of description regarding configurations of drive electrodes formed on a drive surface and sensing electrodes formed on a sensing surface, the drive electrodes and the sensing electrodes are emphasized in FIG. 1.

Display Unit

As shown in FIG. 1, the display unit is a laminate where a display panel 10, such as a liquid crystal panel or an organic EL panel which is driven by a drive circuit, and a touch panel 20 are stuck together with a transparent adhesive layer. A display surface 10S formed as a rectangle is laid out on a surface of the display panel 10, and the display surface 10S displays thereon images on the basis of external image data.

The touch panel is a laminate where an electrode 21 for a touch sensor and a cover layer 22 are stuck together with a transparent adhesive layer 23. The cover layer 22 is made from such as a glass substrate or a resin film. A surface of the cover layer 22 opposite to the transparent adhesive layer 23 serves as an operation surface 20S of the touch panel 20. The transparent adhesive layer 23 has optical transparency which allows image displayed on the display surface 10S to pass therethrough. For example, a polyether-based adhesive agent or an acrylic-based adhesive agent is used for the transparent adhesive layer 23.

It should be noted that, in manufacturing the touch panel 20, the electrodes 21 for a touch sensor and the cover layer 22 may be stuck together with the transparent adhesive layer 23, or, as another method different from this, the following method may be adopted. That is, a thin film layer made of a conductive metal, such as copper, is formed directly or through an under layer on the cover layer 22 such as of a resin film. On top of that, there is formed a resist layer having pattern shape of the electrodes for a touch sensor. Subsequently, using a wet etching method using such as ferric chloride, the thin film layer is formed to be the electrode for a touch sensor extending along an X direction, thereby obtaining a first film. Similarly to the electrodes for a touch sensor extending along the X direction, the thin film is formed to be the electrodes for a touch sensor extending along a Y direction, thereby obtaining a second film. Thereafter, the first film and the second film are stuck together with the transparent adhesive layer 23.

A transparent substrate 31, which is a constituent element of the electrode 21 for a touch sensor and an example of a first substrate, is layered on the whole display surface 10S formed in the display panel 10, and allows images formed on the display surface 10S to pass therethrough. The transparent substrate 31 is made of, for example, a substrate such as of transparent glass substrate or transparent resin film. The transparent substrate 31 may have a single-layer structure made of one substrate, or may have a multi-layer structure where two or more substrates are layered.

A surface of the transparent substrate 31 opposite to the display panel 10 is designed to be the drive surface 31S. On the drive surface 31S of the transparent substrate 31, a plurality of drive electrode wires 31L, which are only an example of electrode wires, are arranged along a first arrangement direction D1, which is one direction. Each of the drive electrode wires 31L is formed into a zigzag line extending along a second arrangement direction D2 perpendicular to the first arrangement direction D1.

Each of the drive electrode wires 31L is grouped by nine in order from the drive electrode wire 31L at the end of the first arrangement direction D1. Nine drive electrode wires 31L included in one group are connected to one pad 31T, and the nine drive electrode wires 31L arranged at intervals along the first arrangement direction D1 configure one drive electrode 31DP, an example of a first strip electrode.

A metal film made of such as copper or aluminum, a metal oxide film made of such as zinc oxide, or a complex oxide film made of such as indium tin oxide or indium gallium zinc oxide is used for each of the drive electrode wires 31L. Indium tin oxide or indium gallium zinc oxide is formed from a metal oxide including indium, tin, gallium, zinc and the like. Further, a silver nanowire, a conductive polymer film or a conductive film is also used for each of the drive electrode wires 31L. The conductive films include a graphene film or the like. The drive electrodes 31DP each including nine drive electrode wires 31L are connected to a selection circuit 34 respectively, and receive drive voltage applied by the selection circuit 34 to be selected.

The drive electrode wires 31L and the pads 31T may be formed at the same time by etching a thin film formed on the drive surface 31S through a mask. Alternatively, the drive electrode wires 31L and the pads 31T may be made of materials different from each other by the respective processes. Also, the drive electrode wires 31L and the pads 31T may be formed on the respective substrates different from the transparent substrate 31, and formed by pasting the drive electrode wires 31L and the pads 31T from the respective substrates onto the transparent substrate 31.

The drive surface 31S, the drive electrode wires 31L and the pads 31T are pasted together on a transparent dielectric substrate 33, which is an example of a second substrate, with a transparent adhesive layer 32. The transparent adhesive layer 32 has optical transparency to allow images displayed on the display surface 10S to pass through. The transparent adhesive layer 32 binds the combination of the drive surface 31S, the drive electrode wires 31L and the pads 31T to the transparent dielectric substrate 33. For example, a polyether-based adhesive agent or an acrylic-based adhesive agent is used for the transparent adhesive layer 32. The transparent adhesive layer 32 and the transparent dielectric substrate 33 are constituent elements. The drive electrode wires 31L and the pads 31T are formed on the back surface of the transparent dielectric substrate.

The transparent dielectric substrate 33 is, for example, made of a substrate such as a transparent resin film of polyethylene terephthalate or a transparent glass substrate. The transparent dielectric substrate 33 may have a single-layer structure formed by one substrate, or may have a multiple-layer structure where two or more substrates are layered. The transparent dielectric substrate 33 has optical transparency for allowing the image displayed on the display surface 10S to pass therethrough and appropriate relative permittivity to detect electrical capacitance between electrodes.

The surface of the transparent dielectric substrate 33 opposite to the transparent adhesive layer 32 is set to be a sensing surface 33S. On the sensing surface 33S of the transparent dielectric substrate 33, a plurality of sensing electrode wires 33L, an example of the electrode wires, are arranged along the second arrangement direction D2. Each of the sensing electrode wires 33L is formed into a zigzag line extending along the first arrangement direction D1.

Each of the sensing electrode wires 33L is assigned to a respective group of nine in order from the sensing electrode wire 33L at the end of the second arrangement direction D2. Nine sensing electrode wires 33L included in one group are connected to one pad 33T. The nine sensing electrode wires 33L connected to the one pad 33T and arranged at intervals along the second arrangement direction D2 configure one sensing electrode 33SP, an example of the facing strip electrode which is a second strip electrode.

Similarly to the drive electrode wire 31L, a metal film made of such as copper or aluminum, a metal oxide film made of such as zinc oxide, or a complex oxide film made of such as indium tin oxide or indium gallium zinc oxide is used for each of the sensing electrode wires 33L. Indium tin oxide or indium gallium zinc oxide is formed from a metal oxide including indium, tin, gallium, zinc and the like. Further, a silver nanowire, a conductive polymer film or a conductive film is also used for each of the sensing electrode wires 33L. The conductive films include a graphene film or the like. The sensing electrodes 33SP each including nine sensing electrode wires 33L are connected to a detection circuit 35 respectively. The voltages of the respective sensing electrodes 33SP are detected by the detection circuit 35.

The sensing electrode wires 33L and the pads 33T may be formed at the same time by etching a thin film formed on the sensing surface 33S through a mask. Alternatively, the sensing electrode wires 33L and the pads 33T may be made of materials different from each other by respective processes. Also, the sensing electrode wires 33L and the pads 33T may be formed on respective substrates different from the transparent dielectric substrate 33, and formed by pasting the sensing electrode wires 33L and the pads 33T from the respective substrates onto the transparent dielectric substrate 33.

The sensing surface 33S, the sensing electrode wires 33L and the pads 33T are pasted together on a cover layer 22 with the transparent adhesive layer 23 described above.

Cross-Section Structure of Display Unit

Figure 2:
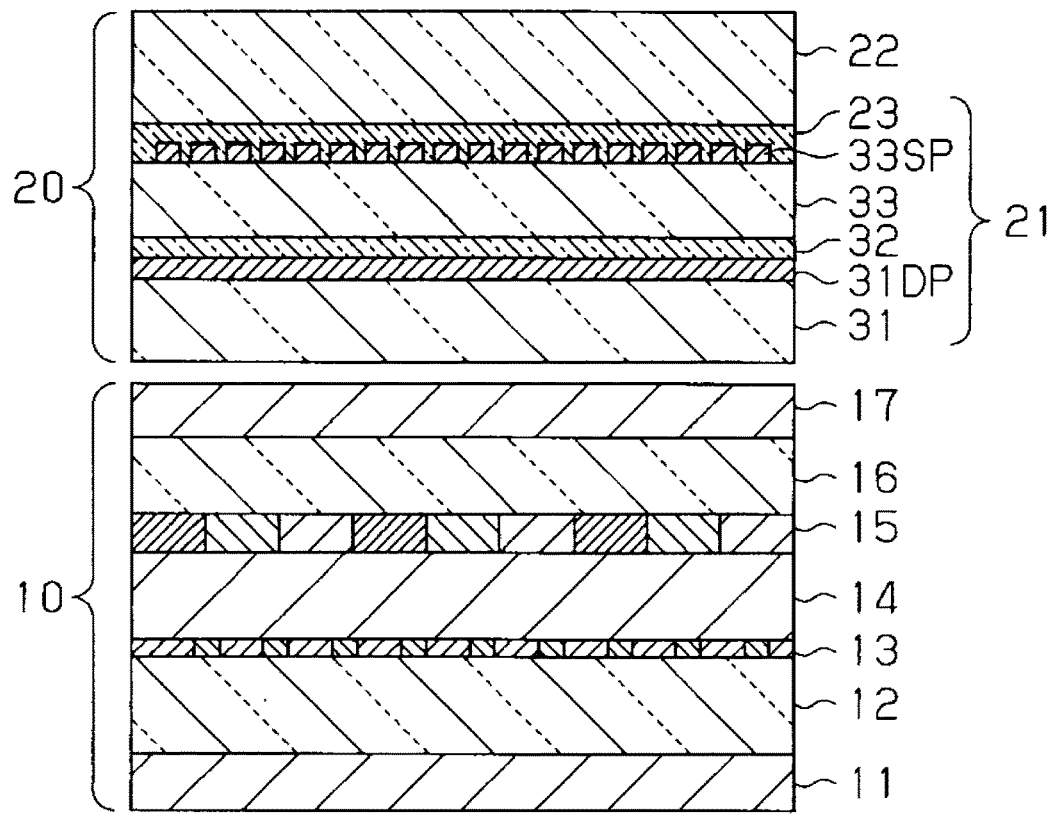
FIG. 2 is a cross-section view showing a cross-section structure of the display unit in FIG. 1.

With reference to FIG. 2, here is described a cross-section structure of the display unit. It should be noted that FIG. 2 shows a liquid crystal panel as an example of the display panel.

In the touch panel 20, in order from the constituent element closer to the display panel 10, the transparent substrate 31, the drive electrodes 31DP, the transparent adhesive layer 32, the transparent dielectric substrate 33, the sensing electrodes 33SP, the transparent adhesive layer 23 and the cover layer 22 are disposed. The transparent adhesive layer 32 is disposed between the drive electrode 31DP and the transparent dielectric substrate 33, covering the peripheral of each electrode wire 31L configuring the drive electrode 31DP and filling spaces between the adjacent electrode wires 31L. The transparent adhesive layer 23 is disposed between the sensing electrode 33SP and the cover layer 22, covering the periphery of each electrode wire 33L configuring the sensing electrode 33SP and filling spaces between the adjacent electrode wires 33L.

In the display panel 10, in order from the constituent element furthest from the touch panel 20, a plurality of constituent elements of the display panel 10 are arranged as follows. That is, in order from the constituent element furthest from the touch panel 20, a lower polarizer 11, a thin film transistor (referred to as a TFT) substrate 12, a TFT layer 13, a liquid crystal layer 14, a color filter layer 15, a color filter substrate 16 and an upper polarizer 17 are disposed. Of these, at the TFT layer 13, pixel electrodes configuring sub pixels are disposed in a matrix. In the color filter layer 15, black matrices define a plurality of areas each having a rectangular shape facing each of the sub pixels. In each of the areas defined by the black matrices, there is disposed the color layer which changes white light to light of any one of red, green or blue color.

Electrical Configuration of Touch Panel

Figure 3:
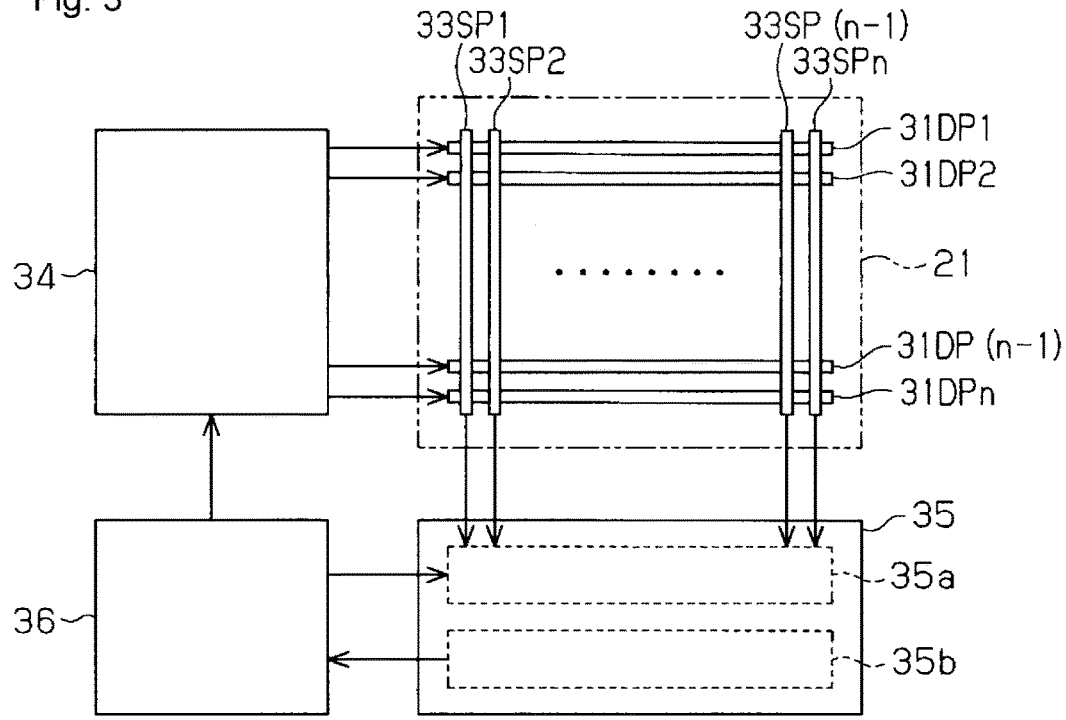
FIG. 3 is a block diagram showing an electrical configuration of a touch panel of the display unit in FIG. 1.

With reference to FIG. 3, now is described an electrical configuration of the touch panel 20. It should be noted that an electrical configuration of the mutual-capacitance type touch panel 20 is described as an example of the electrostatic touch panel 20.

As shown in FIG. 3, the touch panel 20 has the selection circuit 34, the detection circuit 35, and a control section 36. The selection circuit 34 can be connected to the drive electrodes 31DP. The detection circuit 35 can be connected to the sensing electrodes 33SP. The control section 36 is connected to the selection circuit 34 and the detection circuit 35.

The control section 36 generates a start timing signal for making the selection circuit 34 start generating a drive signal to each of the drive electrodes 31DP, and outputs it. The control section 36 generates a scan timing signal for making the selection circuit 34 scan targets to which the drive signal is supplied serially from a first drive electrode 31DP1 to an n-th drive electrode 31DPn, and outputs it.

The control section 36 generates a start timing signal for making the detection circuit 35 start detecting the current passing through each sensing electrode 33SP, and outputs it. The control section 36 generates a scan timing signal for making the detection circuit 35 scan targets to be detected serially from a first sensing electrode 33SP1 to the n-th sensing electrode 33SPn, and output it.

The selection circuit 34 starts generating the drive signal on the basis of the start timing signal which the control section 36 has output, and scans output targets of the drive signal from the first drive electrode 31DP1 to the n-th drive electrode 31DPn on the basis of the scan timing signal which the control section 36 has output.

The detection circuit 35 has a signal acquiring section 35a and a signal processing section 35b. The signal acquiring section 35a starts acquiring a current signal which is an analog signal generated in each sensing electrode 33SP, on the basis of the start timing signal which the control section 36 has output. Thereafter, the signal acquiring section 35a scans acquisition targets of the current signal from a first sensing electrode 33SP1 to n-th sensing electrode 33SPn, on the basis of the scan timing signal which the control section 36 has output.

The signal processing section 35b processes each current signal which the signal acquiring section 35a has acquired, generates a voltage signal which is a digital value, and outputs the generated voltage signal to the control section 36. Thus, the selection circuit 34 and the detection circuit 35 generate a voltage signal from a current signal which changes depending on change in electrical capacitance, thereby measuring change in electrical capacitance between the drive electrode 31DP and the sensing electrode 33SP. The selection circuit 34 and the detection circuit 35 are an example of a peripheral circuit driving the electrodes for the touch panel.

The control section 36 detects the position on the touch panel 20 which a user is contacting, on the basis of the voltage signal which the signal processing section 35b has output.

The touch panel 20 is not limited to the aforementioned mutual-capacitance type touch panel 20, but may be a self-capacitance type touch panel.

Electrode 31DP, 33SP

Figure 4:
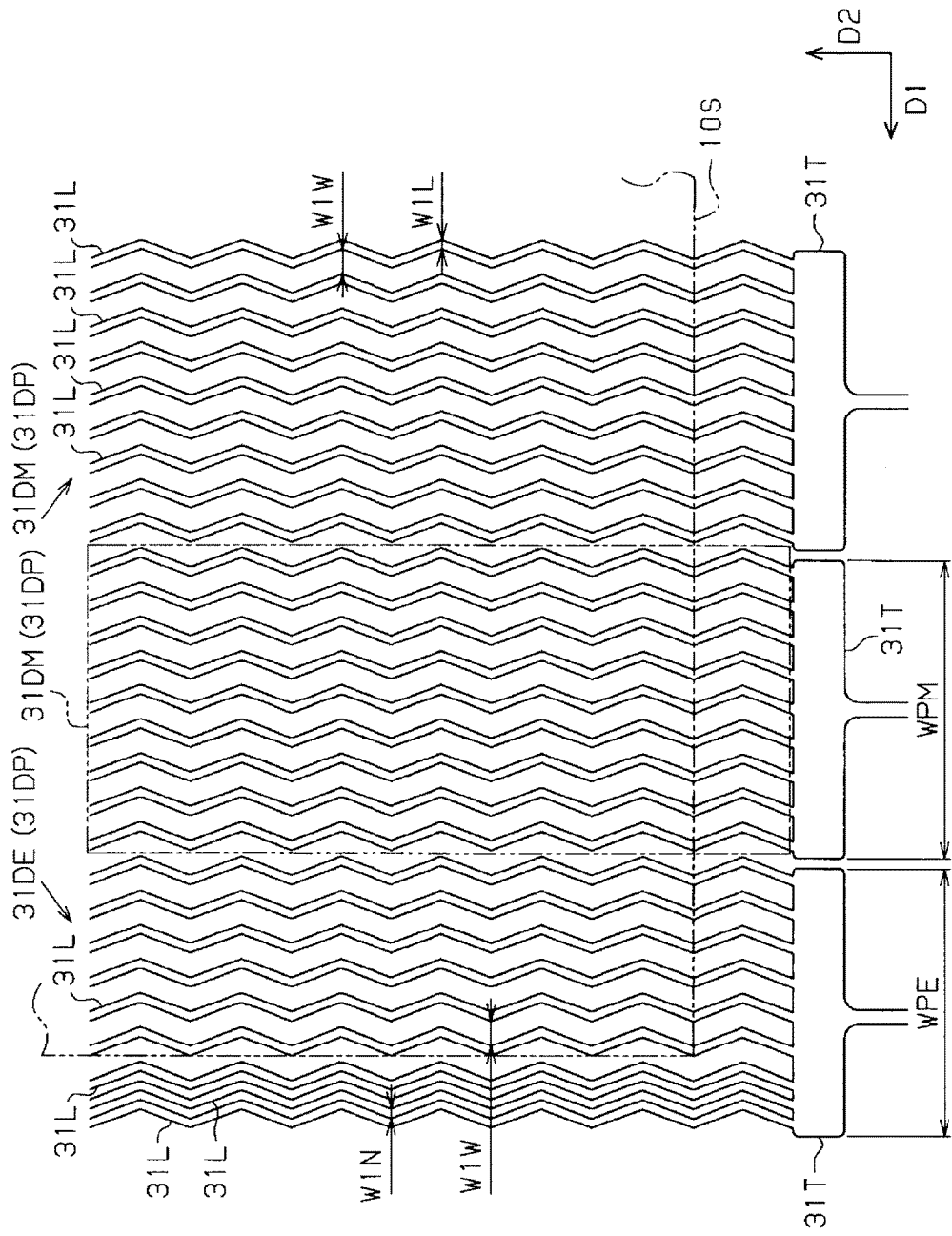
FIG. 4 is a plan view showing the design of drive electrodes of the display unit in FIG. 1.
Figure 5:
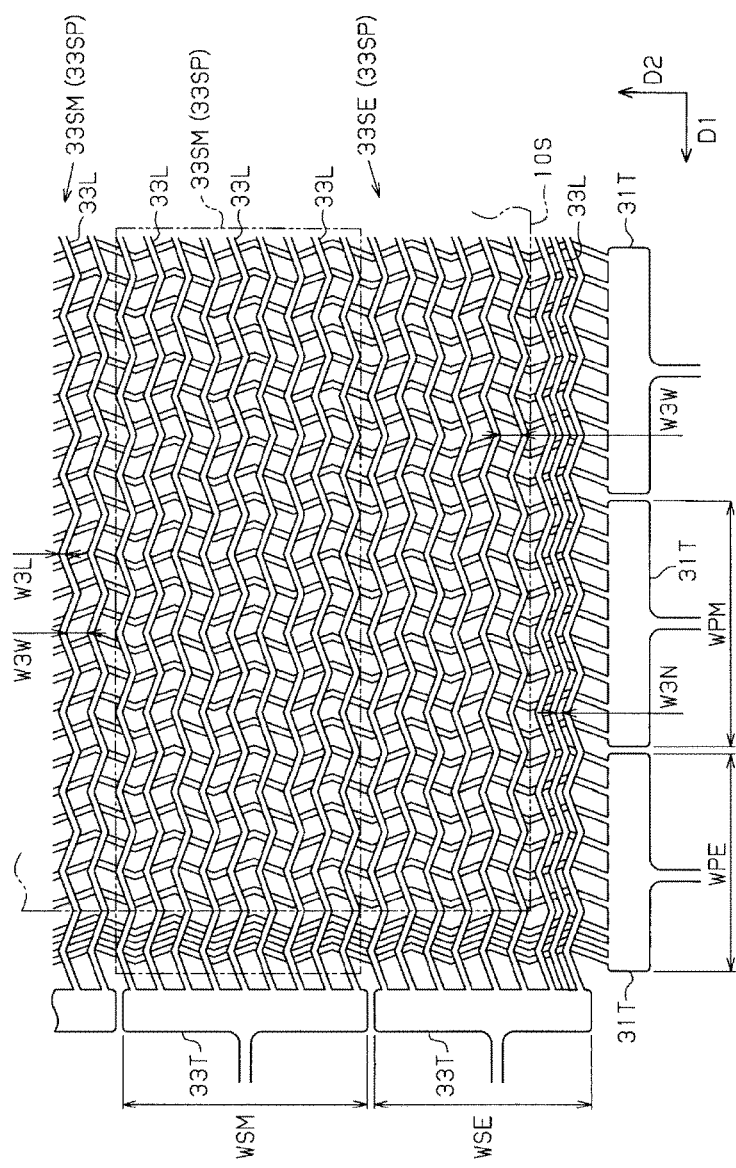
FIG. 5 is a plan view showing a relationship between designs of the drive electrodes and sensing electrodes of the display unit in FIG. 1.

Next, with reference to FIGS. 4 and 5, here are described configurations of the drive electrode 31DP and the sensing electrode 33SP. FIG. 4 is a plan view showing the planar structure of the drive electrode 31DP. FIG. 5 is a plan view of the drive electrode 31DP and the sensing electrode 33SP viewed from a direction in which the drive electrode 31DP and the sensing electrode 33SP are layered. It should be noted that the line widths of the drive electrode wire 31L and the line widths of the sensing electrode wire 33L are emphasized in FIG. 4 and FIG. 5, for convenience of description of the arrangement of the drive electrode wires 31L and arrangement of the sensing electrode wires 33L.

Drive Electrode 31DP

As shown in FIG. 4, one drive electrode 31DP includes the nine drive electrode wires 31L formed in a zigzag shape extending along the second arrangement direction D2, and is the strip electrode extending along the second arrangement direction D2. That is, each area of the drive electrodes 31DP includes, in the drive surface 31S, the nine drive electrode wires 31L and the spaces between the drive electrode wires 31L adjacent to each other. The drive electrodes 31DP are equal to each other in area of each drive electrode. Each of the drive electrodes 31DP are arranged along the first direction D1.

Of the plurality of drive electrodes 31DP, the drive electrodes 31DP disposed at both ends in the area where the drive electrodes 31DP are arranged are set as end drive electrodes 31DE. Of the plurality of drive electrodes 31DP, the drive electrodes 31DP other than the end drive electrodes 31DE are set as middle drive electrodes 31DM.

In the first arrangement direction D1, each position of the middle drive electrodes 31DM is a position overlapping the display surface 10S. The length along the first direction D1 of the middle drive electrodes 31DM are set as middle electrode widths WPM, and the middle electrode width WPM is set at, for example, 5.4 mm.

In the first arrangement direction D1, each position of the two end drive electrodes 31DE is a position extending outside of the display surface 10S from within the display surface 10S. In each of the two end drive electrodes 31DE, the length along the first arrangement direction D1 is set as an end electrode width WPE. The end electrode width WPE is smaller than that of the middle electrode width WPM, and is set at, for example, 4.8 mm.

The end electrode width WPE is smaller than the middle electrode width WPM. Therefore, in the area where the drive electrodes 31DP having the end electrode widths WPE and the middle electrode width WPM are arranged, the length along the first arrangement direction D1 is smaller compared to the configuration where all drive electrodes 31DP have the middle electrode width WPM. This prevents the end portion of the area where the drive electrodes are arranged from including any area other than the target area of sensing. Here, the target area of sensing is the portion overlapping the display surface 10S, of the area where the drive electrodes 31DP are arranged.

In each drive electrode wire 31L, the length along the first arrangement direction D1 is set as a drive electrode wire width W1L, and the drive electrode wire width W1L is set at, for example, 5 μm.

In the drive electrode wires 31L of the middle drive electrode 31DM, the spaces between the drive electrode wires 31L adjacent to each other are set as drive electrode wire space widths W1W. The drive electrode wire space width W1W is set at, for example, 600 μm.

The drive electrode wire 31L of the end drive electrode 31DE has the same width as the drive electrode wire 31L of the middle drive electrode 31DM. That is, each total area occupied by nine drive electrode wires 31L of each drive electrode 31DP in each of the plurality of the drive electrodes 31DP is even in the drive surface 31S and equal to each other.

It should be noted that the width of the drive electrode wire 31L of the end drive electrode 31DE may be larger than the width of the drive electrode wire 31L of the middle drive electrode 31DM.

In the drive electrode wires 31L of the end drive electrode 31DE, the spaces between the drive electrode wires 31L adjacent to each other are set as drive electrode wire space widths W1W and end drive electrode wire space widths W1N. The end drive electrode wire space width W1N is set at, for example, 300 μm, ½ of the drive electrode wire space width W1W. The end drive electrode 31DE includes portions having the drive electrode wire space widths W1W as an example of the first electrode portion, and includes portions having the end drive electrode wire space widths W1N as an example of the second electrode portion.

The end drive electrode wire space width W1N is smaller than the drive electrode wire space width W1W. Accordingly, the area occupied by the drive electrode wires 31L in the unit area of the end drive electrode 31DE is larger than the area occupied by the drive electrode wires 31L in the unit area of the middle drive electrode 31DM. In other words, in the end drive electrode 31DE, the ratio of the total area of the drive electrode wires 31L to the area of the drive electrode 31DP is larger than the ratio in the middle drive electrode 31DM.

This prevents the electrical capacitance of the end drive electrode 31DE from being smaller than the electrical capacitance of the middle drive electrode 31DM, although the end electrode width WPE is smaller than the middle electrode width WPM. As a result, this prevents detection accuracy of the electrical capacitance in the end drive electrode 31DE from being lower than detection accuracy of the electrical capacitance in the middle drive electrode 31DM. Here, the unit area of the drive electrode 31DP is a size including two or more drive electrode wire 31L in the middle drive electrode 31DM.

It is preferred that two drive electrode wires 31L separated from each other by the end drive electrode wire space width W1N are disposed at the ends of the area in which the drive electrodes 31DP are arranged. The drive electrode wires 31L arranged with the end drive electrode wire space width W1N therebetween are disposed more densely than the drive electrode wires 31L arranged with the drive electrode wire space width W1W therebetween. In this regard, if the drive electrode wires 31L arranged with the end drive electrode wire space width W1N therebetween are disposed at the ends of the area where the drive electrodes 31DP are arranged, the drive electrode wires 31L arranged densely are difficult to view.

It is preferred that the end drive electrode wire space width W1N is twice the thickness of the transparent dielectric substrate 33 or more. If the end drive electrode wire space width W1N is twice the thickness of the transparent dielectric substrate 33 or more, variation in density of the drive electrode wires 31L becomes difficult to see. As the end drive electrode wire space width W1N become small, the electrical capacitance between the drive electrode wires 31L becomes large. In this regard, if the end drive electrode wire space width W1N is twice the thickness of the transparent dielectric substrate 33 or more, variation in electrical capacitance between the drive electrode wire 31L and the sensing electrode wire 33L due to the electrical capacitance between the drive electrode wires 31L can be suppressed.

Sensing Electrode 33SP

As shown in FIG. 5, one sensing electrode 33SP includes the nine sensing electrode wires 33L formed in a zigzag shape extending along the first arrangement direction D1, and is the strip electrode extending along the first arrangement direction D1. That is, each area of the sensing electrodes 33SP includes, in the sensing surface 33S, the nine sensing electrode wires 33L and the spaces between the sensing electrode wires 33L adjacent to each other. The sensing electrodes 33SP are equal to each other in area of each sensing electrode. Each of the sensing electrodes 33SP is arranged along the second direction D2, and is disposed at a position where it crosses a respective drive electrode 31DP when viewed from the direction of the planar view.

Of the plurality of sensing electrodes 33SP, the sensing electrodes 33SP disposed at both ends in the area where the sensing electrodes 33SP are arranged are set as end sensing electrodes 33SE. Of the plurality of sensing electrodes 33SP, the sensing electrodes 33SP other than the end sensing electrodes 33SE are set as middle sensing electrodes 33SM.

In the second arrangement direction D2, each position of the middle sensing electrodes 33SM is a position overlapping the display surface 10S. The length along the second direction D2 of the middle sensing electrodes 33SM are set as middle electrode widths WSM, and the middle electrode width WSM is set at, for example, 5.4 mm.

In the second arrangement direction D2, each position of the two end sensing electrodes 33SE is a position extending outside of the display surface 10S from within the display surface 10S. In each of the two end sensing electrode 33SE, the length along the second arrangement direction D2 is set as an end electrode width WSE. The end electrode width WSE is smaller than that of the middle electrode width WSM, and is set at, for example, 4.8 mm like the end electrode width WPE.

The end electrode width WSE is smaller than the middle electrode width WSM. Therefore, in the area where the sensing electrodes 33SP having the end electrode widths WSE and the middle electrode width WSM are arranged, the length along the second arrangement direction D2 is smaller, compared to the configuration where all sensing electrodes 33SP have the middle electrode width WSM. This prevents the end portion of the area where the sensing electrodes are arranged from including any area other than the target area of sensing.

In each sensing electrode wire 33L, the length along the second arrangement direction D2 is set as a sensing electrode wire width W3L, and the sensing electrode wire width W3L is set at, for example, 5 μm.

In the sensing electrode wires 33L of the middle drive electrode 33SM, the spaces between the sensing electrode wires 33L adjacent to each other are set as sensing electrode wire space widths W3W. The sensing electrode wire space width W3W is set at, for example, 600 μm.

The sensing electrode wire 33L of the end sensing electrode 33SE has the same width as the sensing electrode wire 33L of the middle sensing electrode 33SM. That is, each total area occupied by nine sensing electrode wires 33L of each sensing electrode 33SP in each of the sensing electrodes 33SP is uniform in the sensing surface 33S and equal to each other.

It should be noted that the width of the sensing electrode wire 33L of the end sensing electrode 33SE may be larger than the width of the sensing electrode wire 33L of the middle sensing electrode 33SM.

In the sensing electrode wires 33L of the end sensing electrode 33SE, the spaces between the sensing electrode wires 33L adjacent to each other are set as sensing electrode wire space widths W3W and end sensing electrode wire space widths W3N. The end sensing electrode wire space width W3N is set at, for example, 300 μm, ½ of the sensing electrode wire space width W3W. The end sensing electrode 33SE includes portions having the sensing electrode wire space widths W3W as an example of the first electrode portion, and includes portions having the end sensing electrode wire space widths W3N as an example of the second electrode portion.

The end sensing electrode wire space width W3N is smaller than the sensing electrode wire space width W3W. Accordingly, the area occupied by the sensing electrode wires 33L in the unit area of the end sensing electrode 33SE is larger than the area occupied by the sensing electrode wires 33L in the unit area of the middle sensing electrode 33SM. In other words, in the end sensing electrode 33SE, the ratio of the total area of the sensing electrode wires 33L to the area of the sensing electrode 33SP is larger than the ratio in the middle sensing electrode 33SM.

This prevents the electrical capacitance of the end sensing electrode 33SE from being smaller than the electrical capacitance of the middle sensing electrode 33SM, although the end electrode width WSE is smaller than the middle electrode width WSM. As a result, this prevents detection accuracy of the electrical capacitance in the end sensing electrode 33SE from being lower than detection accuracy of the electrical capacitance in the middle sensing electrode 33SM. Here, the unit area of the sensing electrode 33SP is a size including two or more sensing electrode wires 33L in the middle sensing electrode 33SM.

It is preferred that two sensing electrode wires 33L separated from each other by the end sensing electrode wire space width W3N are disposed at the ends of the area where the sensing electrodes 33SP are arranged. The sensing electrode wires 33L arranged with the end sensing electrode wire space width W3N therebetween are disposed more densely than the sensing electrode wires 33L arranged with the sensing electrode wire space width W3W therebetween. In this regard, if the sensing electrode wires 33L arranged with the end sensing electrode wire space width W3N therebetween are disposed at the ends of the area where the sensing electrodes 33SP are arranged, the sensing electrode wires 33L arranged densely are difficult to see.

It is preferred that the end sensing electrode wire space width W3N has twice the thickness of the transparent dielectric substrate 33 or more. If the end sensing electrode wire space width W3N has twice the thickness of the transparent dielectric substrate 33 or more, variation in density of the sensing electrode wires 33L becomes difficult to see. As the end sensing electrode wire space width W3N becomes small, the electrical capacitance between the sensing electrode wires 33L becomes large. In this regard, if the end sensing electrode wire space width W3N has twice the thickness of the transparent dielectric substrate 33 or more, variation in electrical capacitance between the sensing electrode wire 31L and the sensing electrode wire 33L due to the electrical capacitance between the sensing electrode wires 33L can be suppressed.

Result of Numerical Calculation of Electrical Capacitance

Subsequently, here is described the electrical capacitance between the drive electrode 31DP and the sensing electrode 33SP obtained by using numerical calculation.

In the numerical calculation of the electrical capacitance between the drive electrode 31DP and the sensing electrode 33SP, firstly, each thickness of constituent members, relative permittivity and sheet resistance are set at the following values. Further, air layers which are 1 mm in thickness and 1.00 in relative permittivity are set on the upper side of the cover layer 22 and the lower side of the transparent substrate 31. The electrical capacitance between the drive electrode 31DP and the sensing electrode 33SP is calculated using a numerical calculation where the Laplace equation for a rectangular target area is solved by a finite element method. The rectangular target area ranges 5 mm along the first arrangement direction D1 and 5 mm along the second arrangement direction D2.

Cover layer 22 Thickness: 700 μm/Relative permittivity: 6.00
Transparent adhesive layer 23
   Thickness: 75 μm/Relative permittivity: 2.60
All sensing electrode wires 33L
   Thickness: 2 μm/Sheet resistance: 0.168 Ω/sq
Transparent dielectric substrate 33
   Thickness: 100 μm/Relative permittivity: 3.25
Transparent adhesive layer 32
   Thickness: 50 μm/Relative permittivity: 2.60
All drive electrode wires 31L
   Thickness: 2 μm/Sheet resistance: 0.168 Ω/sq Transparent substrate 31
   Thickness: 100 μm/Relative permittivity: 3.25
Drive electrode wire space width W1W 600 μm
End drive electrode wire space width W1N 300 μm
Sensing drive electrode wire space width W3W 600 μm
End sensing electrode wire space width W3N 300 μm As the results of the numerical calculation under the aforementioned conditions, in a case where the target area is the middle sensing electrode 33SM and another case where the target area is the end sensing electrode 33SE, the electrical capacitance between the drive electrode 31DP and the sensing electrode 33SP is 1.01 pF. Compared to this, for example, if the number of the sensing electrode wires 33L configuring the middle sensing electrode 33SM is 8, the electrical capacitance between the middle sensing electrode 33SM and the middle drive electrode 31DM lowers to 0.79 pF.

Here, as the configurations for making the end electrode width WPE smaller than the middle electrode width WPM, there might be considered a configuration for reducing the number of the drive electrode wires 31L included in the end drive electrode 31DE. Also, as the configurations for making the end electrode width WSE smaller than the middle electrode width WSM, there might be considered a configuration for reducing the number of the sensing electrode wires 33L included in the end sensing electrode 33SE. However, in the configurations where the number of the electrode wires 31L, 33L is smaller, as shown in the results of the numerical calculation, the electrical capacitance in the end drive electrode 31DE and the end sensing electrode 33SE is lower than the electrical capacitances in the other electrodes 31DP and 33SP.

Compared to this, in the above-described configuration, the area occupied by the electrode wires 31L, 33L in the unit area of the electrodes 31DP, 33SP having the end electrode widths WPE and WSE is larger than the area occupied by the electrode wires 31L, 33L in the unit area of the other electrodes 31DP, 33SP. Accordingly, as shown in the above results of the numerical calculation, the electrodes 31DP, 33SP having the end electrode widths WPE and WSE can have an electrical capacitance similar to those of the other electrodes 31DP, 33SP.

Figure 6:
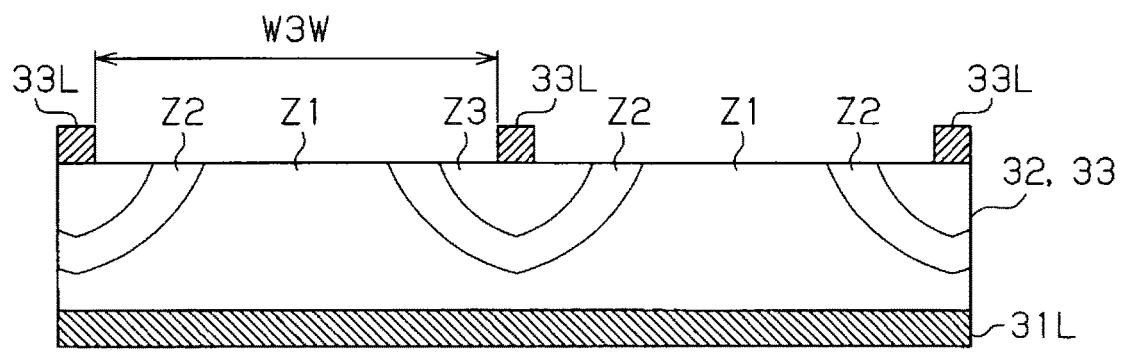
FIG. 6 shows a numerical calculation result of voltage distribution between the sensing electrode and the drive electrode, by using a finite element method, when the space between the sensing electrodes in the electrodes for a touch sensor of the display unit of FIG. 1 is 600 μm.
Figure 7:
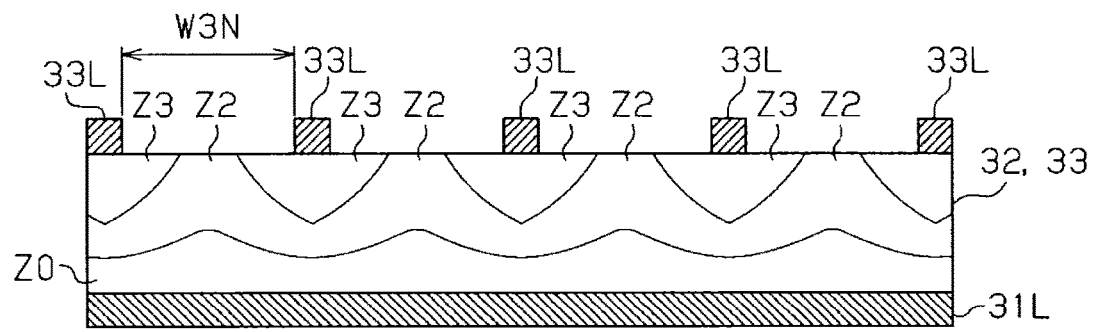
FIG. 7 is shows a numerical calculation result of voltage distribution between the sensing electrode and the drive electrode, by using a finite element method, when the space between the sensing electrodes in the electrodes for a touch sensor of the display unit of FIG. 1 is 300 μm.

Next, with reference to FIG. 6 and FIG. 7, here is described the voltage distribution between the drive electrode 31DP and the sensing electrode 33SP obtained using a numerical calculation.

In FIG. 6 and FIG. 7, the voltage width at a portion where the drive electrode 31DP and the sensing electrode 33SP intersect with each other in planar view is set at 1.0. In FIG. 6 and FIG. 7, relative to the voltage width at the intersecting portion, a zone of not less than 0.8 and not more than 1.0 times the voltage width is set as a first voltage zone Z1, and a zone of not less than 0.7 and less than 0.8 times the voltage width is set as a second voltage zone Z2. Also, in FIG. 6 and FIG. 7, relative to the voltage width at the intersecting portion, a zone showing not less than 0.2 and less than 0.7 times the voltage width is set as a third voltage zone Z3.

In the numerical calculation of the voltage distribution between the drive electrode 31DP and the sensing electrode 33SP, firstly, similarly to the numerical calculation, each thickness of composition members, relative permittivity and sheet resistance are set. Further, air layers which are 1 mm in thickness and 1.00 in relative permittivity are set on the upper side of the cover layer 22 and the lower side of the transparent substrate 31. Thereafter, the voltage applied to the sensing electrode 33SP is 0 V, the voltage applied to the drive electrode 31DP is changed from 3V to 20 V, a numerical calculation where the Laplace equation is solved by a finite element method is used, thereby calculating the voltage distribution between the drive electrode 31DP and the sensing electrode 33SP.

As shown in FIG. 6, in a portion where the space between the sensing electrode wires 33L adjacent to each other is the sensing electrode wire space width W3W, the first voltage zone Z1, the second voltage zone Z2 and the third voltage zone Z3 intervene in the space between the sensing electrode wires 33L which are adjacent to each other. Accordingly, if the interval between the sensing electrode wires 33L adjacent to each other is the sensing electrode wire space width W3W, then between the sensing electrode wire 33L, the interference between the sensing electrode wires 33L can be regarded as negligible.

As shown in FIG. 7, in a portion where the space between the sensing electrode wires 33L adjacent to each other is the end sensing electrode wire space width W3N, the second voltage zone Z2 and the third voltage zone Z3 intervene in the space between the sensing electrode wires 33L adjacent to each other. Accordingly, if the space between the sensing electrode wires 33L adjacent to each other is the end sensing electrode wire space width W3N, then between the sensing electrode wire 33L, the interference between the sensing electrode wires 33L is negligible. That is, if the space (300 μm) between the sensing electrode wires 33L adjacent to each other is at least twice or more the space between the drive electrode 31DP and the sensing electrode 33SP (150 μm), the interference between the sensing electrode wires 33L is negligible.

Behavior of Display Unit

When the display panel 10 displays an image on the display surface 10S, the image displayed on the display surface 10S is output to the surface of the cover layer 22 through the drive electrode 31DP and the sensing electrode 33SP. Of the operation surface which is the surface of the cover layer 22, the area overlapping the display surface 10S in planar view is a portion that can be selected by a finger.

At this time, of the area where the drive electrodes 31DP are arranged, the portion overlapping the display surface 10S is set as a target area of sensing. The drive electrodes 31DP are arranged in the whole target area of sensing. Also, of the area where the sensing electrodes 33SP are arranged, the portion overlapping the display surface 10S is set as a target area of sensing. The sensing electrodes 33SP are arranged in the whole target area of sensing. Accordingly, when a finger or the like contacts the output area of the image on the operation surface, the electrical capacitance between the drive electrode 31DP and the sensing electrode 33SP changes at the portion which the finger or the like contacts. The change in electrical capacitance is detected, thereby sensing the position at which the finger contacts on the operation surface.

Because the end electrode width WPE is smaller than the middle electrode width WPM, in the area where the drive electrodes 31DP having the end electrode widths WPE and the middle electrode width WPM are arranged, the length along the first arrangement direction D1 is shorter. Also, because the end electrode width WSE is smaller than the middle electrode width WSM, in the area where the sensing electrodes 33SP having the end electrode widths WSE and the middle electrode width WSM are arranged, the length along the second arrangement direction D2 is shorter. This prevents the end of the area where the drive electrodes 31DP are arranged and the end of the area where the sensing electrodes 33SP are arranged from including any portion other than the target area of sensing.

Further, since the end drive electrode wire space width W1N is smaller than the drive electrode space width W1W, the area occupied by the drive electrode wires 31L in the unit area of the end drive electrode 31DE is larger than the area occupied by the drive electrode wires 31L in the unit area of the middle drive electrode 31DM. Also, since the end sensing electrode wire space width W3N is smaller than the sensing electrode space width W3W, the area occupied by the sensing electrode wires 33L in the unit area of the end sensing electrode 33SE is larger than the area occupied by the sensing electrode wires 33L in the unit area of the middle sensing electrode 33SM. This can prevent the electrical capacitance of the end drive electrode 31DE from being smaller than the electrical capacitance of the middle drive electrode 31DM, and also prevent the electrical capacitance of the end sensing electrode 33SE from being smaller than the electrical capacitance of the middle sensing electrode 33SM.

According to the above first embodiment, the following advantages are obtained.

(1) Compared to the configuration where all drive electrodes 31DP are equal in width of the first arrangement direction D1 of the drive electrode 31DP, the end of the area where the drive electrodes 31DP are arranged can be prevented from including any area other than the target area of sensing.

(2) Compared to the configuration where all sensing electrodes 33SP are equal in width of the second arrangement direction D2 of the sensing electrode 33SP, the end of the area where the sensing electrodes 33SP are arranged can be prevented from including any area other than the target area of sensing.

(3) The area occupied by the electrode wires in the unit area of the end drive electrode 31DE is larger than the area occupied by the electrode wires in the unit area of the other drive electrode 31DP. Accordingly, while the area of the end drive electrode (strip electrode) 31DE itself is smaller than that of the other drive electrodes (other strip electrode) 31DP, the electrical capacitance of the end drive electrode 31DE can be prevented from being smaller than the electrical capacitances of the other drive electrodes 31DP.

(4) The area occupied by the electrode wires in the unit area of the end sensing electrode 33SE is larger than the area occupied by the electrode wires in the unit area of the other sensing electrode 33SP. Accordingly, while the area of the end sensing electrode (strip electrode) 33SE itself is smaller than those of the other sensing electrodes (other strip electrode) 33SP, the electrical capacitance of the end sensing electrode 33SE can be prevented from being smaller than the electrical capacitances of the other sensing electrodes 33SP.

In the end drive electrode 31DE, the space between the end drive electrode wires 31L adjacent to each other is the drive electrode wire space width W1N. This allows the area occupied by wires in the unit area to be larger than those in the other strip electrodes (i.e., middle drive electrode 31DM). Accordingly, in order to increase the area occupied by the wires in the unit area, it is not needed to change the size of the drive electrode wire 31L and the shape of the drive electrode wire 31L.

In the end sensing electrode 33SE, the space between the sensing electrode wire 33L adjacent to each other is the end sensing electrode wire space width W3N. This allows the area occupied by wires in the unit area to be larger than those in the other strip electrodes (i.e., middle sensing electrode 33SM). Accordingly, in order to increase the area occupied by the wires in the unit area, it is not needed to change the size of the sensing electrode wire 33L and the shape of the sensing electrode wire 33L.

(7) The end drive electrode 31DE includes the portion where the space of the drive electrode wire 31L is the drive electrode wire space width W1W. Accordingly, the end drive electrode 31DE and the middle drive electrode 31DM are prevented from being seen as different electrodes from each other.

Further, the portion having the drive electrode wire space width W1W which included in the end drive electrode 31DE as the first electrode portion is adjacent to the middle drive electrode 31DM as the other strip electrode. Accordingly, the boundary between the end drive electrode 31DE and the middle drive electrode is prevented from being seen.

(8) The end sensing electrode 33SE includes the portion where the space of the sensing electrode wire 33L is the sensing electrode wire space width W3W. Accordingly, the end sensing electrode 33SE and the middle sensing electrode 33SM are prevented from being seen and recognized as different electrodes from each other.

Further, the portion having the sensing electrode wire space width W3W which included in the end sensing electrode 33SE as the first electrode portion is adjacent to the middle sensing electrode 33SM as the other strip electrode. Accordingly, the boundary between the end sensing electrode 33SE and the middle sensing electrode is prevented from being seen and recognized.

(9) Interference relating to the voltage width between the drive electrode wires 31L adjacent to each other is suppressed, and also interference relating to the voltage width between the sensing electrode wires 33L adjacent to each other is suppressed. Accordingly, detection accuracy of the electrical capacity in the end drive electrode 31DE and the end sensing electrode 33SE is further prevented from being lower than detection accuracy of the electrical capacity in the middle drive electrode 31DM and the middle sensing electrode 33SM.

Further, the electrical capacitance between the wires (drive electrode wire 31L, sensing electrode wire 33L) in the end strip electrode (end drive electrode 31DE, end sensing electrode 33SE) is prevented from being larger than an electrical capacitance through the transparent dielectric substrate. Accordingly, detection accuracy of the electrical capacitance in the end strip electrode is further prevented from being lower than detection accuracy of the electrical capacitance in the other strip electrodes.

The above first embodiment can be carried out as follows.

Figure 8:
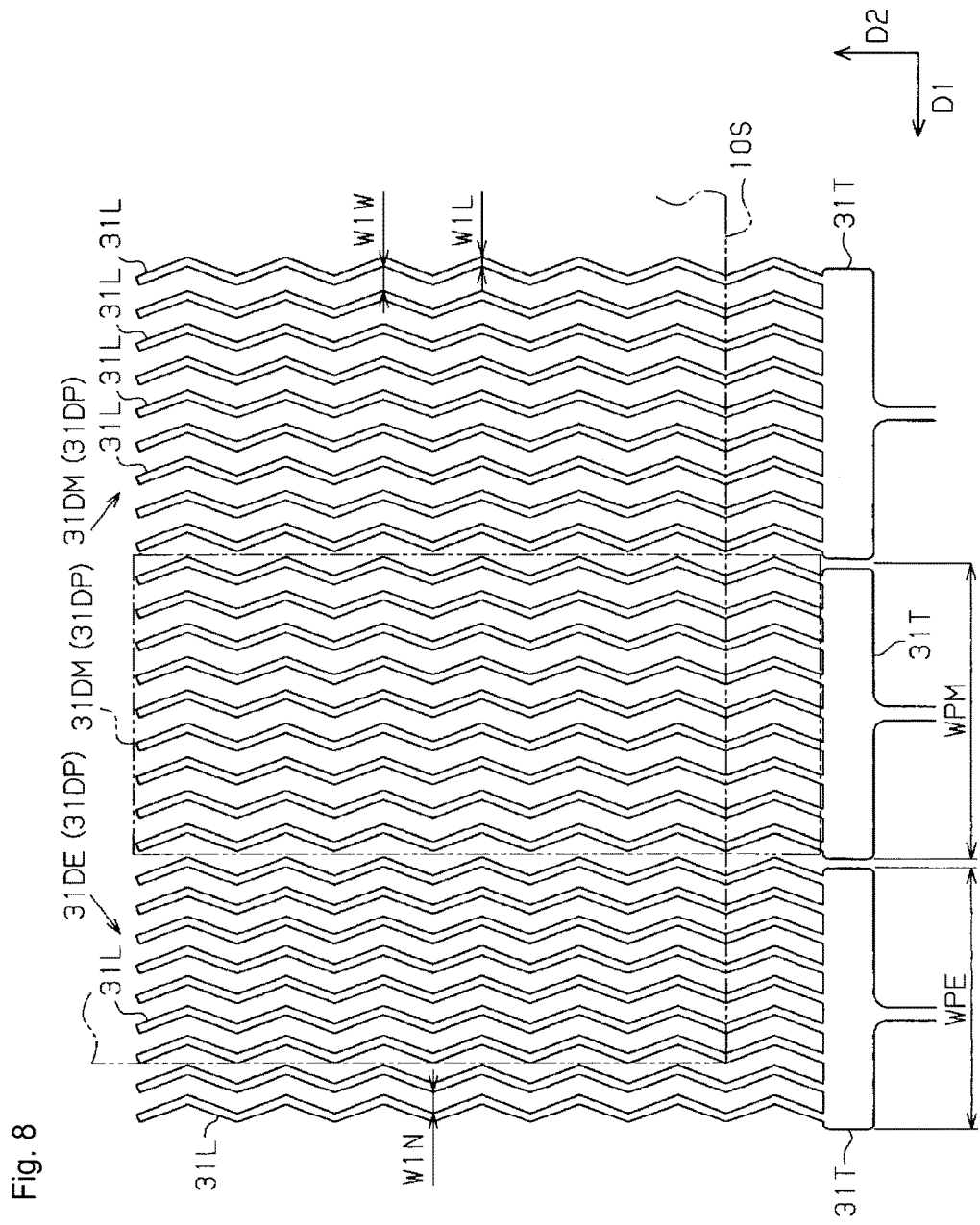
FIG. 8 is a plan view showing a planar structure of the drive electrodes in a modification.

As shown in FIG. 8, in the whole end drive electrode 31DE, the spaces between the adjacent drive electrode wires 31L are set at the end drive electrode wire space width W1N smaller than the drive electrode wire space width W1W.

Similarly, in the end sensing electrode 33SE, in all sensing electrode wires 33L included in the end sensing electrode 33SE, the spaces between the adjacent sensing electrode wires 33L are set at the end sensing electrode wire space width W3N smaller than the sensing electrode wire space width W3W.

The width of the drive electrode wire 31L in the end drive electrode 31DE may be the same as the width of the drive electrode wire 31L in the middle drive electrode 31DM. In this case, the end drive electrode wire space width W1N only has to be smaller than the drive electrode wire space width W1W.

Figure 9:
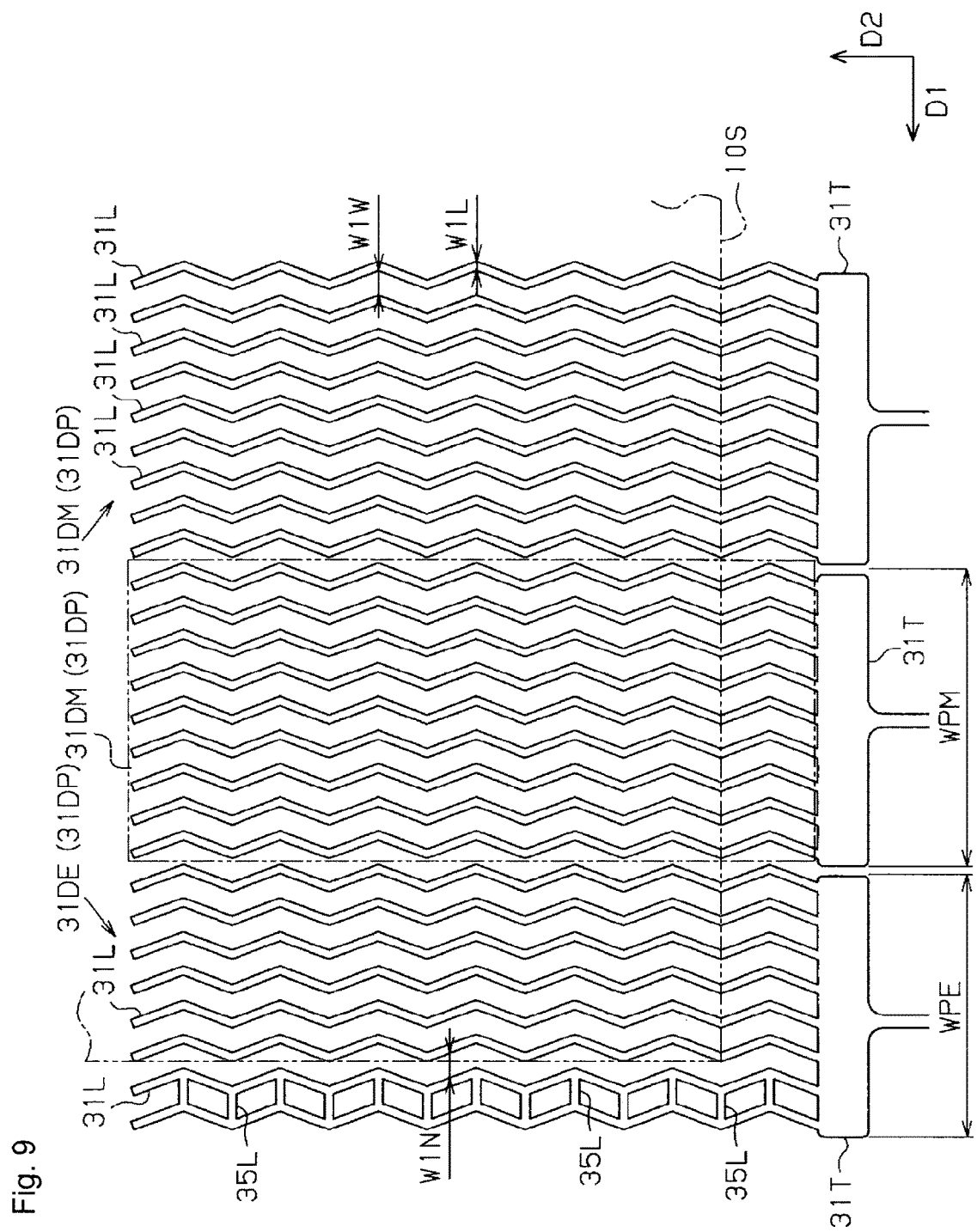
FIG. 9 is a plan view showing a planar structure of the drive electrodes in a modification.

As shown in FIG. 9, the end drive electrode wire space width W1N is set similar to the drive electrode wire space width W1W, and the above-described drive electrode wire 31L is set as the first drive electrode wire. While the end drive electrode 31DE includes a smaller number of the first drive electrode wires than the middle drive electrode 31DM includes, the end drive electrode may include the second drive electrode wire 35L, which is an example of the second electrode wire, in addition to the first drive electrode wire, which is an example of the first electrode wire. In this case, it is preferred that the second drive electrode wire 35L is formed along a direction crossing the first drive electrode wire and the end drive electrode 31DE includes drive electrode wires formed into a grid-like shape.

This configuration can also make the area occupied by the drive electrode wires in the unit area of the end drive electrode 31DE larger than the area occupied by the drive electrode wires in the unit area of the middle drive electrode 31DM. Since the space between the first drive electrode wires adjacent to each other is kept on the drive surface 31S, distribution of the density of the first drive electrode wires is prevented from being seen. In this case, the unit area is a size including two or more first drive electrode wires and one or more second drive electrode wires. In the configuration including the second drive electrode wire 35L, similarly to the above-described embodiment, the end drive electrode wire space width W1N may be smaller than the drive electrode wire space width W1W.

The end sensing electrode wire space width W3N may be set similar to the sensing electrode wire space width W3W, and the above-described sensing electrode wire 33L may be set as the first drive electrode wire. While the end sensing electrode 33SE includes a smaller number of the first drive electrode wires than the middle sensing electrode 33SM includes, the end sensing electrode may include the second sensing electrode wire, which is an example of the second electrode wire, in addition to the first sensing electrode wire, which is an example of the first electrode wire. This configuration can also obtain, in the end sensing electrode 33SE, advantages similar to the above-described configuration of the end drive electrode 31DE.

The end drive electrode 31DE of the above-described embodiment may further include the above-described second drive electrode wire, also the end sensing electrode 33SE of the above-described embodiment may further include the above-described second sensing electrode wire.

In the whole end drive electrode 31DE, the spaces between the drive electrode wires 31L adjacent to each other may be set at the end drive electrode wire space width W1N smaller than the drive electrode wire space width W1W, and the end drive electrode 31DE may include the above-described second drive electrode wire. Also, the whole end sensing electrode 33SE, the spaces between the sensing electrode wires 33L adjacent to each other may be set at the end sensing electrode wire space width W3N smaller than the sensing electrode wire space width W3W, and the end sensing electrode 33SE may include the above-described second sensing electrode wire.

The end drive electrode 31DE may include a drive electrode wire having a larger wire width than the drive electrode wire width W1L in the middle drive electrode 31DM. Even in this configuration, if the end electrode width WPE is smaller than the middle electrode width WPM and the area occupied by the drive electrode wires in the unit area of the end drive electrode 31DE is larger than that in the middle drive electrode 31DM, effects as above can be obtained. In this case, the unit area is a size including two or more drive electrode wires 31L.

Also, the end sensing electrode 33SE may include a sensing electrode wire having a larger wire width than the sensing electrode wire width W3L in the middle sensing electrode 33SM. Even in this configuration, if the end electrode width WSE is smaller than the middle electrode width WSM and the area occupied by the sensing electrode wires in the unit area of the end sensing electrode 33SE is larger than that in the middle sensing electrode 33SM, effects as above can be obtained. In this case, the unit area is a size including two or more sensing electrode wires 33L.

The number of the drive electrode wires 31L configuring the drive electrode 31DP only has to be two or more, also the number of the sensing electrode wires 33L configuring the sensing electrode 33SP only has to be two or more.

The drive electrode wire spaces width W1W which is a distance between the drive electrode wires 31L adjacent to each other may be different between each pair of the drive electrode wires 31L adjacent to each other. Basically, the area occupied by the drive electrode wires 31L in the unit area of the end drive electrode 31DE only has to be larger than the area occupied by the drive electrode wires 31L in the unit area of the middle drive electrode 31DM.

The sensing electrode wire spaces width W3W which is a distance between the sensing electrode wires 33L adjacent to each other may be different between each pair of the sensing electrode wires 33L adjacent to each other. Basically, the area occupied by the sensing electrode wires 33L in the unit area of the end sensing electrode 33SE only has to be larger than the area occupied by of the sensing electrode wires 33L in the unit area of the middle sensing electrode 33SM.

The target area of sensing may be set at a portion other than the portion overlapping the display surface 10S, of the area where the drive electrodes 31DP are arranged. Also, the target area of sensing may be set at a portion other than the portion overlapping the display surface 10S, of the area where the sensing electrodes 33SP are arranged. For example, the target area of sensing may be an area specifically determined according to a demand from manufacturing processes or a structure of at least one of an electrode 21 for a touch sensor, a touch panel 20 and a display panel 10.

Of the plurality of the drive electrodes 31DP, only the drive electrode 31DP at one end in the first arrangement direction D1 may be set as the end drive electrode 31DE. Also, of the plurality of the sensing electrodes 33SP, only the sensing electrode 33SP at one end in the first arrangement direction D1 may be set as the end sensing electrode 33SE.

The end drive electrode wire space width W1N in the end drive electrode 31DE may be the same as the drive electrode wire space width W1W. Or, the end sensing electrode wire space width W3N in the end sensing electrode 33SE may be the same as the sensing electrode wire space width W3W. Basically, the configuration only has to satisfy that the end drive electrode wire space width W1N is smaller than the drive electrode wire space width W1W or the end sensing electrode wire space width W3N is smaller than the sensing electrode wire space width W3W.

Each of the drive electrodes 31DP may be formed into a grid-like shape where the drive electrode wires cross each other. In this case, the end drive electrode 31DE only has to have a configuration where the density of the drive electrode wires is higher than the density in the middle drive electrode 31DM. Basically, the configuration only has to satisfy that the end electrode width WPE is smaller than the middle electrode width WPM and the area occupied by the drive electrodes in the unit area of the end drive electrode 31DE is larger than the area occupied by the drive electrodes in the unit area of the middle drive electrode 31DM.

Each of the sensing electrodes 33SP may be formed into a grid-like shape where the sensing electrode wires cross each other. In this case, the end sensing electrode 33SE only has to have a configuration where the density of the sensing electrode wires is higher than the density in the middle sensing electrode 33SM. Basically, the configuration only has to satisfy that the end electrode width WSE is smaller than the middle electrode width WSM and the area occupied by the sensing electrodes in the unit area of the end sensing electrode 33SE is larger than the area occupied by the sensing electrodes in the unit area of the middle sensing electrode 33SM.

The end electrode width WPE may be larger than the middle electrode width WPM, also the end electrode width WSE may be larger than the middle electrode width WSM. Basically, the area occupied by the electrode wires in the unit area of the strip electrode (end strip electrode) disposed at the end of the arrangement direction only has to be larger than the area occupied by the electrode wires in the unit area of the other strip electrode.

The drive electrode 31DP may be a facing strip electrode (the second strip electrode), and the sensing electrode 33SP may be a strip electrode (the first strip electrode).

The first substrate may support the plurality of the strip electrodes, the second substrate may support the plurality of the facing strip electrodes, and the transparent dielectric substrate may include the first substrate and the second substrate. This configuration can increase freedom degree of capacitance which the transparent dielectric substrate has, since the capacitance which the transparent dielectric substrate has is determined by the capacitance of the first substrate and the capacitance of the second substrate.

The first substrate may support the plurality of the strip electrodes, the second substrate may support the plurality of the facing strip electrode, and the transparent dielectric substrate may be any one of the first substrate and the second substrate. The transparent dielectric substrate may be formed by one substrate. These configurations can prevent the thickness of the transparent dielectric substrate from increasing excessively, since the transparent dielectric substrate is formed by any one of the first substrate and the second substrate.

Second Embodiment

Figure 10:
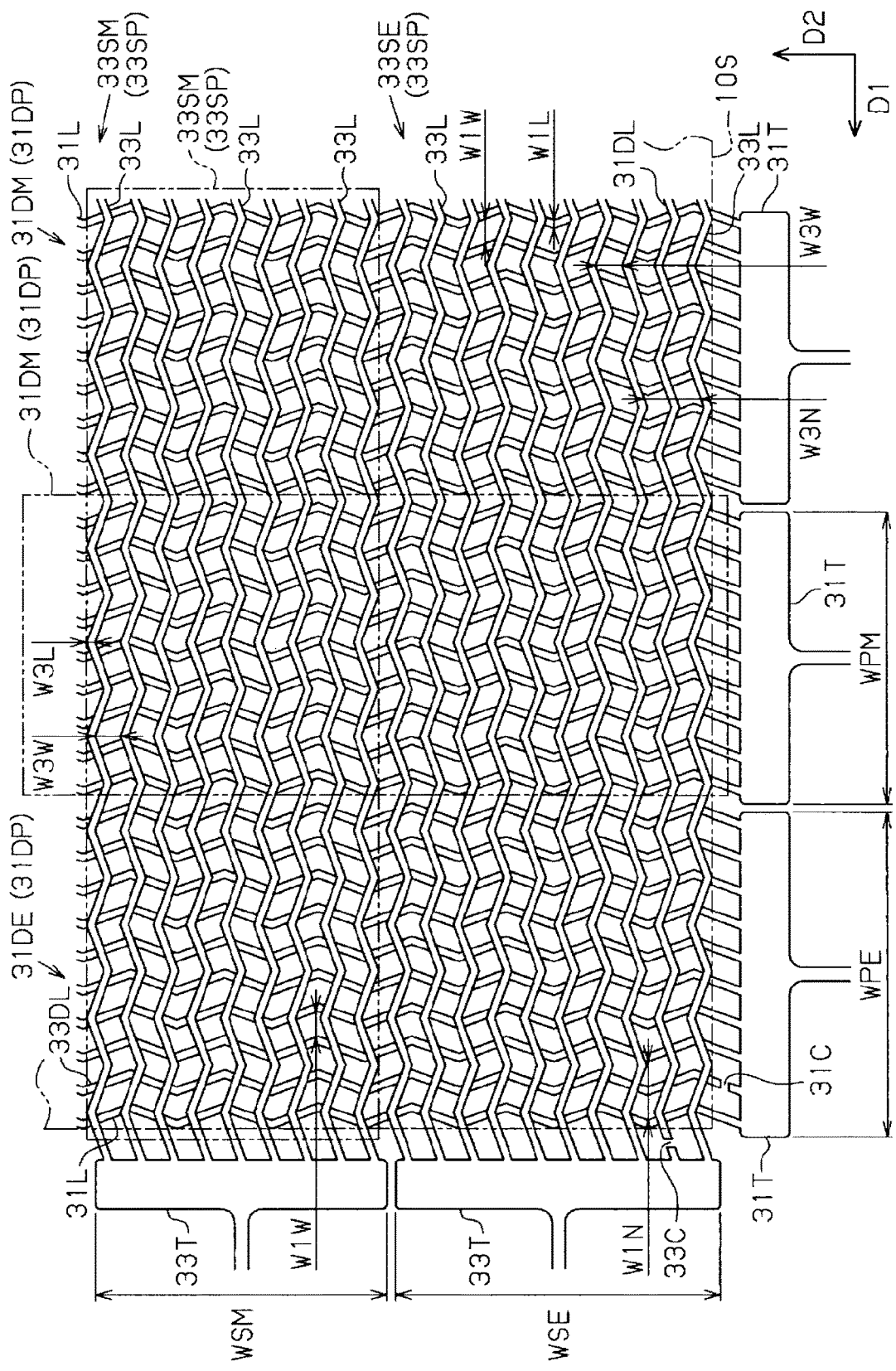
FIG. 10 is a plan view showing relation of designs of the drive electrodes and sensing electrodes in a second embodiment.

With reference to FIG. 10 to FIG. 2, hereinafter is described a second embodiment where electrodes for a touch sensor in this disclosure, a touch panel and a display unit are embodied.

Figure 11:
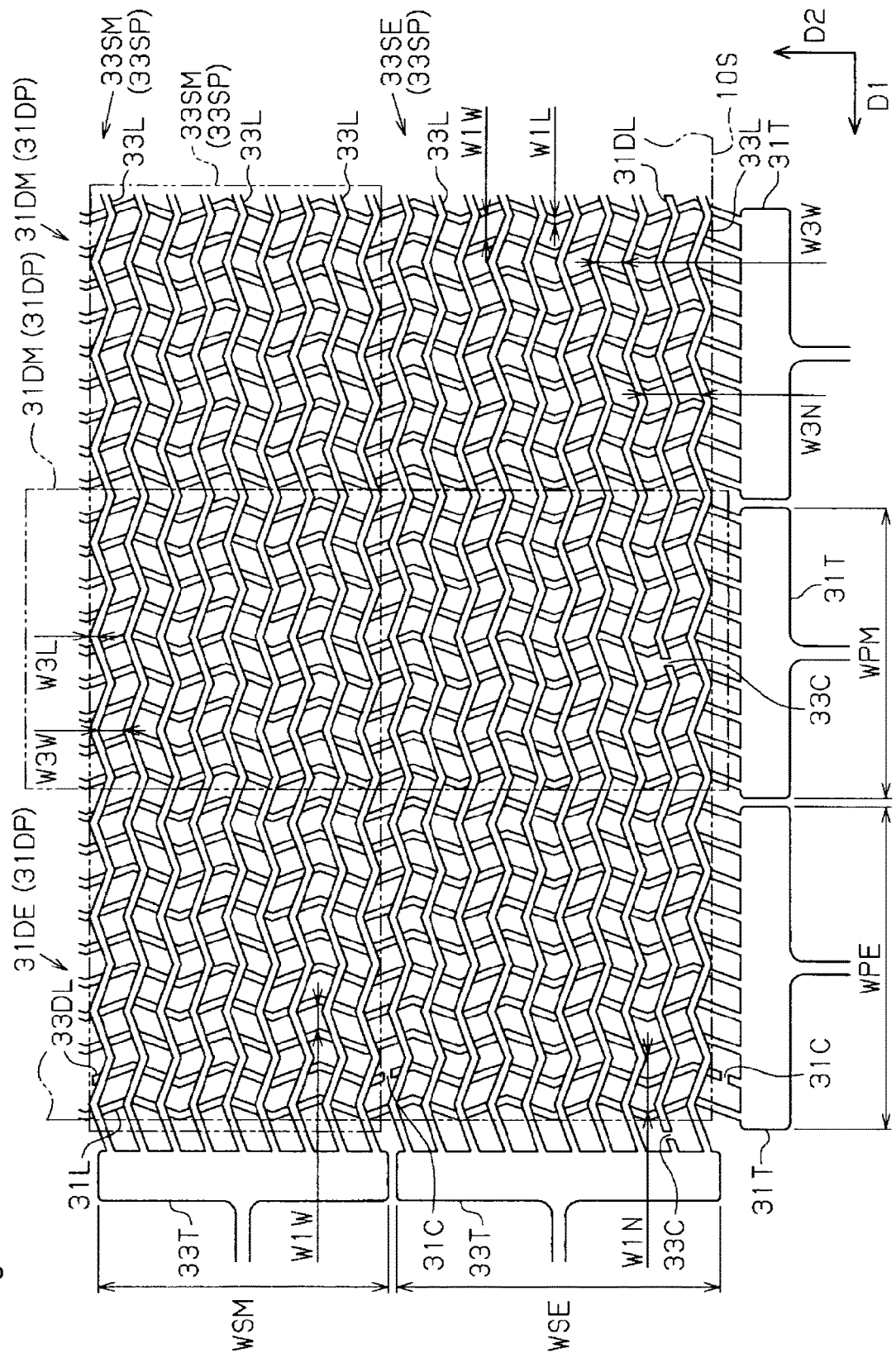
FIG. 11 is a plan view showing relation of designs of the drive electrodes and sensing electrodes in a modification.
Figure 12:
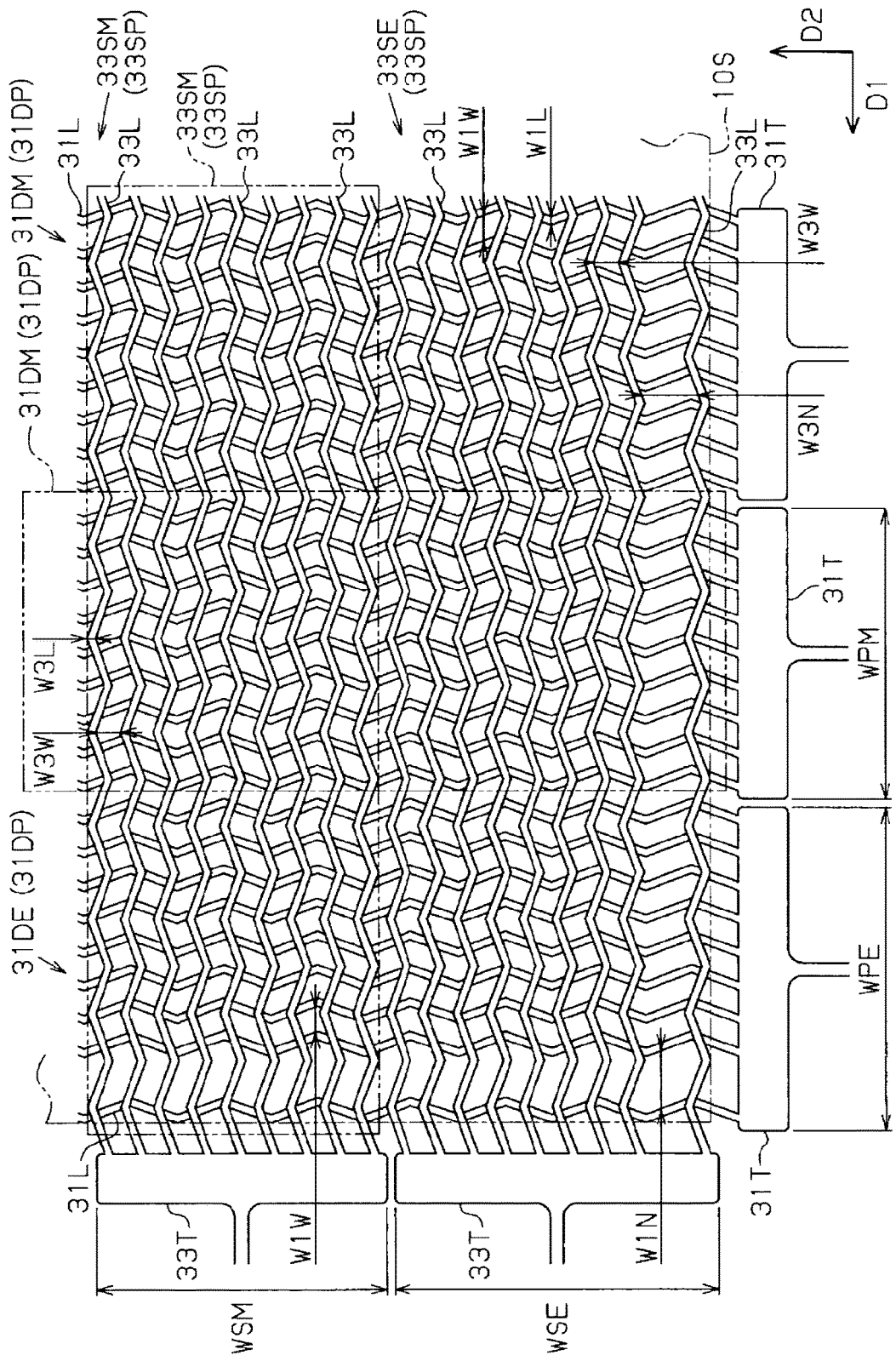
FIG. 12 is a plan view showing a relationship between designs of the drive electrodes and sensing electrodes in a modification.

The second embodiment differs from the first embodiment mainly in the position of the drive electrode relative to the display surface, the configuration of the end drive electrode, the position of the sensing electrode relative to the display surface, and the configuration of the sensing electrode. Accordingly, configurations different from the first embodiment are mainly described below, the same configurations as the first embodiment are labeled with the same reference symbols, and the description thereof is omitted. Each of FIG. 10 to FIG. 12 is a plan view showing the relation of the design of the drive electrodes and the sensing electrodes, and corresponds to FIG. 5 described in the first embodiment.

Drive electrode 31DP

As shown in FIG. 10, one drive electrode 31DP has nine drive electrode wires 31L formed into zigzag lines extending along the second arrangement direction D2, and is a strip electrode extending along the second arrangement direction D2. Each area of a plurality of the drive electrodes 31DP includes, on the drive surface parallel with the display surface 10S, nine drive electrode wires 31L, and spaces between the drive electrode wires 31L adjacent to each other. Each of the drive electrodes 31 is disposed at a position intersecting with a respective sensing electrode 33SP, when viewed from a direction of planar view.

Of the plurality of drive electrodes 31DP, the drive electrodes 31DP at both ends in the area where the drive electrodes 31DP are arranged are set as end drive electrodes 31DE. Of the plurality of drive electrodes 31DP, the drive electrode 31DP other than the end drive electrode 31DE is set as middle drive electrode 31DM.

In the first direction D1, each position of a plurality of the middle drive electrodes 31DM is at a position overlapping the display surface 10S. In the middle drive electrodes 31DM, the length along the first arrangement direction D1 is set as a middle electrode width WPM. The middle electrode width WPM is the same as a width of a pad 31T to which the nine drive electrode wires 31L configuring the middle drive electrode 31DM connect.

In the first arrangement direction D1, each of two end drive electrodes 31DE is disposed inside the area facing the display surface 10S. In the two end drive electrodes 31DE, the length along the first arrangement direction D1 is set as end electrode width WPE. The end electrode width WPE is the same as a width of a pad 31T to which the nine drive electrode wires 31L configuring the end drive electrode 31DE connect, and is larger than the middle electrode width WPM.

The end electrode width WPE is larger than the middle electrode width WPM. Accordingly, in the area where the drive electrodes 31DP having the end electrode width WPE and the middle electrode width WPM are arranged, the length along the first arrangement direction D1 is larger, compared to the configuration where all drive electrodes 31DP have the middle electrode width WPM. This can prevent occurrence of a portion missing in the target area of sensing at the end of the area where the drive electrodes 31DP are arranged.

In each of the drive electrode wires 31L, the length along the first arrangement direction D1 is set as drive electrode wire width W1L, and the drive electrode wire width W1L is set at, for example, 5 µm.

In the drive electrode wires 31L of the middle drive electrode 31DM, the space between the drive electrode wires 31L adjacent to each other is set as a drive electrode wire space width W1W, and the drive electrode wire space width W1W is set at, for example, 600 µm.

The drive electrode wire 31L of the end drive electrode 31DE has the same width as the drive electrode wire 31L of the middle drive electrode 31DM. That is, in each of the drive electrodes 31DP, the total area of nine drive electrode wires 31L of each drive electrode 31DP is even on the drive surface and the same as each other.

As long as the drive electrodes 31DP are equal in total area of the drive electrode wires 31L of each drive electrode 31DP, the widths of the drive electrode wires 31L of the end drive electrode 31DE may include a width larger than that of the drive electrode wire 31L of the middle drive electrode 31DM. The widths of the drive electrode wires 31L of the end drive electrode 31DE may include a width smaller than that of the drive electrode wire 31L of the middle drive electrode 31DM.

In the drive electrode wires 31L of the end drive electrode 31DE, the spaces between the drive electrode wires 31L adjacent to each other are set as drive electrode wire space width W1W and end drive electrode wire space width W1N. The end drive electrode wire space width W1N is set at, for example, twice the drive electrode wire space width W1W, 1200 μm. The end drive electrode 31DE includes a portion having the drive electrode wire space width W1W as an example of the first electrode portion, and a portion having the end drive electrode wire space width W1N as an example of the second electrode portion.

The end drive electrode wire space width W1N is larger than the drive electrode wire space width W1W. Therefore, the area occupied by the drive electrode wires 31L in the unit area of the end drive electrode 31DE is smaller than the area occupied by the drive electrode wires 31L in the unit area of the middle drive electrode 31DM, compared to a configuration where all the spaces between the drive electrode wires 31L have the drive electrode wire space width W1W. That is, the ratio of the total area of the drive electrode wires 31L to the area of the drive electrode 31DP in the end drive electrode 31DE is smaller than the ratio of the total area of the drive electrode wires 31L to the area of the middle drive electrode 31DM in the middle drive electrode 31DM. In this case, the unit area of the drive electrode 31DP is a size including two or more drive electrode wires 31L in the middle drive electrode 31DM.

Here, the area of the drive surface facing the display surface 10S corresponds to a target area of sensing which needs to serve as the touch sensor. When all of the drive electrodes 31DP have the middle electrode width WPM like a conventional touch sensor, at the end of the target area of sensing, there is formed, as a portion where no drive electrode 31DP is disposed, a space corresponding to the difference between the middle electrode width WPM and the end electrode width WPE. In order to fill the space, a new drive electrode 31DP is added to the end of the target area of sensing, and the portion out of the target area of sensing is removed.

In this regard, if the end drive electrode wire space width W1N is larger than the drive electrode wire space width W1W, without adding a new drive electrode 31DP, the target area of sensing is filled with the drive electrodes 31DP. Since the drive electrodes 31DP are equal in total area of the drive electrode wires 31L of each drive electrode 31DP, the electrical capacitance in the end drive electrode 31DE disposed at the end in the first arrangement direction D1 is prevented from being smaller than the electrical capacitance in the middle drive electrode 31DM.

It is preferred that the two drive electrode wires 31L separated from each other by the end drive electrode wire space width W1N are disposed at the end of the area where the drive electrodes 31DP are arranged. The drive electrode wires 31L arranged with a space of the end drive electrode wire space width W1N therebetween are disposed less densely than the drive electrode wires 31L arranged with a space of the sensing electrode wire space width W3W therebetween. In this regard, if the drive electrode lines 31L arranged having the end drive electrode wire space width W1N are disposed at the end of the area where the drive electrodes 31DP are arranged, the drive electrode wires 31L arranged less densely becomes difficult to see.

Sensing Electrode 33SP

One sensing electrode 33SP has sensing electrode wires 33L formed into zigzag lines extending along the first arrangement direction D1, and is a strip electrode extending along the first arrangement direction D1. Each area of a plurality of the sensing electrodes 33SP includes, on the sensing surface parallel with the display surface 10S, nine sensing electrode wires 33L, and spaces between the sensing electrode wires 33L adjacent to each other. Each of the sensing electrodes 33SP is disposed at a position intersecting with a respective drive electrode 31DP, when viewed from a direction of the planar view.

Of the plurality of sensing electrodes 33SP, the sensing electrodes 33SP at both ends in the area where the sensing electrodes 33SP are arranged are set as end sensing electrodes 33SE. Of the plurality of sensing electrodes 33SP, the sensing electrode 33SP other than the end sensing electrode 33SE is set as middle sensing electrode 33SM.

In the second direction D2, each position of a plurality of the middle sensing electrodes 33SM is a position overlapping the display surface 10S. In the middle sensing electrodes 33SM, the length along the second arrangement direction D2 is set as a middle electrode width WSM. The middle electrode width WSM is the same as a width of a pad 33T to which the nine sensing electrode wires 33L configuring the middle sensing electrode 33SM connect.

In the second arrangement direction D2, each of two end sensing electrodes 33SE is disposed inside the area facing the display surface 10S. In the two end sensing electrodes 33SE, the length along the second arrangement direction D2 is set as end electrode width WSE. The end electrode width WSE is the same as a width of a pad 33T to which the nine sensing electrode wires 33L configuring the end sensing electrode 33SE connect, and is larger than the middle electrode width WSM.

The end electrode width WSE is larger than the middle electrode width WSM. Accordingly, in the area where the sensing electrodes 33SP having the end electrode width WSE and the middle electrode width WSM are arranged, the length along the second arrangement direction D2 is larger, compared to the configuration where all sensing electrodes 33SP have the middle electrode width WSM. This can prevent occurrence of a portion missing in the target area of sensing at the end of the area where the sensing electrodes 33SP are arranged.

In each of the sensing electrode wires 33L, the length along the second arrangement direction D2 is set as a sensing electrode wire width W3L, and the sensing electrode wire width W3L is set at, for example, 5 μm.

In the sensing electrode wires 33L of the middle sensing electrode 33SM, the space between the sensing electrode wires 33L adjacent to each other is set as a sensing electrode wire space width W3W, and the sensing electrode wire space width W3W is set at, for example, 600 μm.

The sensing electrode wire 33L of the end sensing electrode 33SE has the same width as the sensing electrode wire 33L of the middle sensing electrode 33SM. That is, in each of the sensing electrodes 33SP, the total area of nine sensing electrode wires 33L of each sensing electrode 33SP is even on the sensing surface and the same as each other.

As long as the sensing electrodes 33SP are equal in total area of the sensing electrode wires 33L of each sensing electrode 33SP, the widths of the sensing electrode wires 33L of the end sensing electrode 33SE may include a width larger than that of the sensing electrode wire 33L of the middle sensing electrode 33SM. The widths of the sensing electrode wires 33L of the end sensing electrode 33SE may include a width smaller than that of the sensing electrode wire 33L of the middle sensing electrode 33SM.

In the sensing electrode wires 33L of the end sensing electrode 33SE, the spaces between the sensing electrode wires 33L adjacent to each other are set as a sensing electrode wire space width W3W and an end sensing electrode wire space width W3N. The end sensing electrode wire space width W3N is set at, for example, 1200 μm which is twice the sensing electrode wire space width W3W. The end sensing electrode 33SE includes a portion having the sensing electrode wire space width W3W as an example of the first electrode portion, and a portion having the end sensing electrode wire space width W3N as an example of the second electrode portion.

The end sensing electrode wire space width W3N is larger than the sensing electrode wire space width W3W. Therefore, the area occupied by the sensing electrode wires 33L in the unit area of the end sensing electrode 33SE is smaller than the area occupied by the sensing electrode wires 33L in the unit area of the middle sensing electrode 33SM, compared to a configuration where all spaces between the sensing electrode wires 33L have the sensing electrode wire space width W3W. That is, the ratio of the total area of the sensing electrode wires 33L to the area of the sensing electrode 33SP in the end sensing electrode 33SE is smaller than the ratio of the total area of the sensing electrode wires 33L to the area of the sensing electrode 33SP in the middle sensing electrode 33SM. In this case, the unit area of the sensing electrode 33SP is a size including two or more sensing electrode wires 33L in the middle sensing electrode 33SM.

Here, the area of the sensing surface facing the display surface 10S corresponds to a target area of sensing which needs to serve as the touch sensor. When all of the sensing electrodes 33SP have the middle electrode width WSM like a conventional touch sensor, at the end of the target area of sensing, there is formed, as a portion where no sensing electrode 33SP is disposed, a space corresponding to the difference between the middle electrode width WSM and the end electrode width WSE. In order to fill the space, a new sensing electrode 33SP is added to the end of the target area of sensing, and the portion out of the target area of sensing is removed.

In this regard, if the end sensing electrode wire space width W3N is larger than the sensing electrode wire space width W3W, without adding a new sensing electrode 33SP, the target area of sensing is filled with the sensing electrodes 33SP. Since the total area of the sensing electrode wires 33L of each sensing electrode 33SP is equal between the sensing electrodes 33SP, the electrical capacitance in the end sensing electrode 33SE disposed at the end in the second arrangement direction D2 is prevented from being smaller than the electrical capacitance in the middle sensing electrode 33SM.

It is preferred that the two sensing electrode wires 33L separated from each other by the end sensing electrode wire space width W3N are disposed at the end of the area where the sensing electrodes 33SP are arranged. The sensing electrode wires 33L arranged having the end sensing electrode wire space width W3N are disposed less densely than the sensing electrode wires 33L arranged keeping the sensing electrode wire space width W3W are. In this regard, if the sensing electrode lines 33L arranged having the end sensing electrode wire space width W3N are disposed at the end of the area where the sensing electrodes 33SP are arranged, the sensing electrode wires 33L arranged less densely becomes difficult to see.

According to the above second embodiment, in addition to the advantages based on the above (1), (2), (7) and (8), the following effects can be obtained.

(10) The end electrode width WPE of the end drive electrode 31DE is larger than the middle electrode width WPM, and the area occupied by the electrode wires in the unit area of the end drive electrode 31DE is smaller than the area occupied by the electrode wires in the unit area of the other drive electrode 31DP. Accordingly, when compared to the conventional configuration, the end drive electrode 31DE is likely to have an electrical capacitance at the same level as the other drive electrode 31DP. In the conventional configuration, a new strip electrode is added to the end in the arrangement direction such that the strip electrodes are disposed in the whole area required to serve as the touch sensor, and a part of the strip electrode is removed, i.e., the portion out of the target area of sensing is removed from the drive electrode 31DP. That is, the electrical capacitance of the end drive electrode 31DE is prevented from being smaller than the electrical capacitance of the other drive electrode 31DP.

(11) The end electrode width WSE of the end sensing electrode 33SE is larger than the middle electrode width WSM, and the area of the electrode wires to the unit area of the end sensing electrode 33SE is smaller than the area of the electrode wires to the unit area of the other sensing electrode 33SP. Accordingly, compared to the conventional configuration, the end sensing electrode 33SE is likely to have the same electrical capacitance as the other sensing electrode 33SP. In the conventional configuration, a new strip electrode is added to the end in the arrangement direction such that the strip electrodes are disposed in the whole area required to serve as the touch sensor, and a part of the strip electrode is removed, i.e., the portion out of the target area of sensing is removed from the sensing electrode 33SP. That is, the electrical capacitance of the end sensing electrode 33SE is prevented from being smaller than the electrical capacitance of the other sensing electrode 33SP.

(12) In the end drive electrode 31DE, the space between the drive electrode wires 31L adjacent to each other is the end drive electrode wire space width W1N. This allows the area occupied by the electrode wires in the unit area to be smaller than that in the other strip electrode (i.e., the middle drive electrode 31DM). Accordingly, in order to decrease the area occupied by the electrode wires in the unit area, there is no need for changing the size of the drive electrode wires 31L and changing the shape of the drive electrode wires 31L.

(13) In the end sensing electrode 33SE, the space between the sensing electrode wires 33L adjacent to each other is the end sensing electrode wire space width W3N. This allows the area occupied by the electrode wires in the unit area to be smaller than that in the other strip electrode (i.e., the middle sensing electrode 33SM). Accordingly, in order to decrease the area of the electrode wires to the unit area, there is no need for changing the size of the sensing electrode wires 33L and changing the shape of the sensing electrode wires 33L.

The above-described second embodiment can be changed and carried out as follows.

In the whole end drive electrode 31DE, the spaces between the drive electrode wires 31L adjacent to each other may be the end drive electrode wire space width W1N larger than the drive electrode wire space width W1W.

Similarly, for the end sensing electrode 33SE, in all sensing electrode wires 33L included in the end sensing electrode 33SE, the spaces between the sensing electrode wires 33L adjacent to each other may be set at with the end sensing electrode wire space width W3N larger than the sensing electrode wire space width W3W.

As shown in the left end of FIG. 10, between the two drive electrode wires 31L which are examples of connection wires and have the end drive electrode wire space width W1N therebetween, there may be disposed a dummy pattern 33DL which is an example of a non-connection wire different from the drive electrode wire 31L. In this case, it is preferred that the dummy pattern 33DL is made of the same materials as the drive electrode wire 31L. Further, it is preferred that the dummy pattern 33DL is separated from the pad 31T with a space portion 31C therebetween and has the substantially same shape as the drive electrode wire 31L. Further, it is preferred that the space portion 31C is disposed between the target area of sensing and the pad 31T.

Between the two drive electrode wires 31L which are examples of connection wires and have the end sensing electrode wire space width W3N therebetween, there may be disposed a dummy pattern 31DL, an example of a non-connection wire different from the sensing electrode wire 33L. In this case, it is preferred that the dummy pattern 31DL is made of the same materials as the sensing electrode wire 33L. Further, it is preferred that the dummy pattern 31DL is separated from the pad 33T with a space portion 33C therebetween and has the substantially same shape as the sensing electrode wire 33L. The sensing electrode wires 33L are connected to the pad 33T. Further, it is preferred that the space portion 33C is disposed between the target area of sensing and the pad 33T.

Further, as shown in FIG. 11, the dummy pattern 33DL may be have a shape divided by two or more space portions 31C, also the dummy pattern 31DL may have a shape divided by two or more space portions 33C. In this case, it is preferred that the two or more space portions 31C are disposed between the sensing electrodes 33SP adjacent to each other, similarly it is also preferred that the two or more space portions 33C are disposed between the drive electrodes 31DP adjacent to each other.

According to the above-described modifications, in addition to the advantages based on the above (10) to (13), the following advantages can be obtained.

(14) The end drive electrode 31DE and the middle drive electrode 31DM are prevented from being seen as strip electrodes different from each other.

(15) The end sensing electrode 33SE and the middle sensing electrode 33SM are also prevented from being seen as strip electrodes different from each other.

(16) The drive electrode wire 31L and the dummy pattern 33DL have the substantially same shapes as each other. Accordingly, for example, ten drive electrode wires 31L connected to one pad 31T are formed, and one of the ten drive electrode wires 31L is cut by the space portion 31C. Thereby, the dummy pattern 33DL can be formed. It is easier to dispose the dummy pattern 33DL at the space having the end drive electrode wire space width W1N larger than the drive electrode wire space width W1W.

(17) The sensing electrode wire 33L and the dummy pattern 31DL have the substantially same shapes as each other. Accordingly, for example, ten sensing electrode wires 33L connected to one pad 33T are formed, and one of the ten sensing electrode wires 33L is cut by the space portion 33C. Thereby, the dummy pattern 31DL can be formed. It is easier to dispose the dummy pattern 31DL at the space having the end sensing electrode wire space width W3N larger than the sensing electrode wire space width W3W.

(18) The space portion 31C and the space 33C are disposed outside the target area of sensing. This prevents the drive electrode wire 31L and the dummy pattern 33DL from being seen and recognized as electrode wires different from each other, and prevents the sensing electrode wire 33L and the dummy pattern 31DL from being viewed and recognized as electrode wires different from each other.

(19) If the space portion 31C is disposed between the sensing electrodes 33SP adjacent to each other, the sensing electrodes 33SP are equal to each other in stray capacitance which the dummy pattern has. Accordingly, even if the dummy pattern 33DL having stray capacitance is added, the sensing electrodes 33SP is prevented from differing from each other in electrical capacitance between a respective sensing electrode 33SP and the end drive electrodes 31DE.

The end drive electrode 31DE may include a drive electrode wire having a wire width larger than the drive electrode wire width W1L of the middle drive electrode 31DM. In the configuration, if the drive electrodes 31DP are equal to each other in total area of the drive electrode wires 31L, and if the ratio of the total area of the drive electrode wires 31L to the area of the drive electrode 31DP in the end drive electrode 31DE is smaller than the ratio in the middle drive electrode 31DM, the advantages based on the above can be obtained.

The end sensing electrode 33SE may include a sensing electrode wire having a wire width larger than the sensing electrode wire width W3L of the middle sensing electrode 33SM. In the configuration, if the sensing electrodes 33SP are equal to each other in total area of the sensing electrode wires 33L, and if the ratio of the total area of the sensing electrode wires 33L to the area of the sensing electrode 33SP in the end sensing electrode 33SE is smaller than the ratio in the middle sensing electrode 33SM, the advantages based on the above can be obtained.

The number of the drive electrode wires 31L configuring the drive electrode 31DP only has to be two or more, also the number of the sensing electrode wires 33L configuring the sensing electrode 33SP only has to be two or more.

The pairs of the drive electrode wires 31L adjacent to each other may be different from each other in drive electrode wire space width W1W which is a distance between the drive electrode wires 31L adjacent to each other.

The pairs of the sensing electrode wires 33L adjacent to each other may be different from each other in sensing electrode wire space width W3W which is a distance between the sensing electrode wires 33L adjacent to each other.

Each of the drive electrode 31DP may be formed by drive electrode wires crossing each other in grid-shape. In this case, in the end drive electrode 31DE, the density of the drive electrode wires only has to be smaller than the density in the middle drive electrode 31DM.

Each of the sensing electrodes 33SP may be formed by sensing electrode wires crossing each other in grid-shape. In this case, in the end sensing electrode 33SE, the density of the sensing electrode wires only has to be smaller than the density in the middle sensing electrode 33SM.

The end electrode width WPE may be equal to or more than the middle electrode width WPM, also the end electrode width WSE may be equal to or more than the middle electrode width WSM.

Basically, the configuration only has to satisfy that the drive electrodes 31DP are equal to each other in total area of the drive electrode wires 31L, and that the ratio of the total area of the drive electrode wires 31L to the area of the drive electrode 31DP in the end drive electrode 31DE is smaller than the ratio in the middle drive electrode 31DM.

Also, the configuration only has to satisfy that the sensing electrodes 33SP are equal to each other in total area of the sensing electrode wires 33L, and that the ratio of the total area of the sensing electrode wires 33L to the area of the sensing electrode 33SP in the end sensing electrode 33SE is smaller than the above ratio in the middle sensing electrode 33SM.

Of the plurality of the drive electrodes 31DP, only the drive electrode 31DP disposed at one end in the first arrangement direction D1 may be set as the end drive electrode 31DE. Also, of the plurality of the sensing electrodes 33SP, only the sensing electrode 33SP disposed at one end in the second arrangement direction D2 may be set as the end sensing electrode 33SE.

The end drive electrode wire space width W1N in the end drive electrode 31DE may be the same as the drive electrode wire space width W1W. The end sensing electrode wire space width W3N in the end sensing electrode 33SE may be the same as the sensing electrode wire space width W3W. Basically, the end drive electrode wire space width W1N only has to be larger than the drive electrode wire space width W1W, or the end sensing electrode wire space width W3N only has to be larger than the sensing electrode wire space width W3W.

In each of the above embodiments, the back surface of the cover layer 22 may be set as the sensing surface, and the back surface of the cover layer 22 may have the sensing electrodes 33SP. Also, the back surface of the transparent dielectric substrate 33 may be set as the drive surface 31S, and the back surface of the transparent dielectric substrate 33 may have the drive electrodes 31SP. In this case, the transparent substrate 31 may be omitted.

Figure 13:
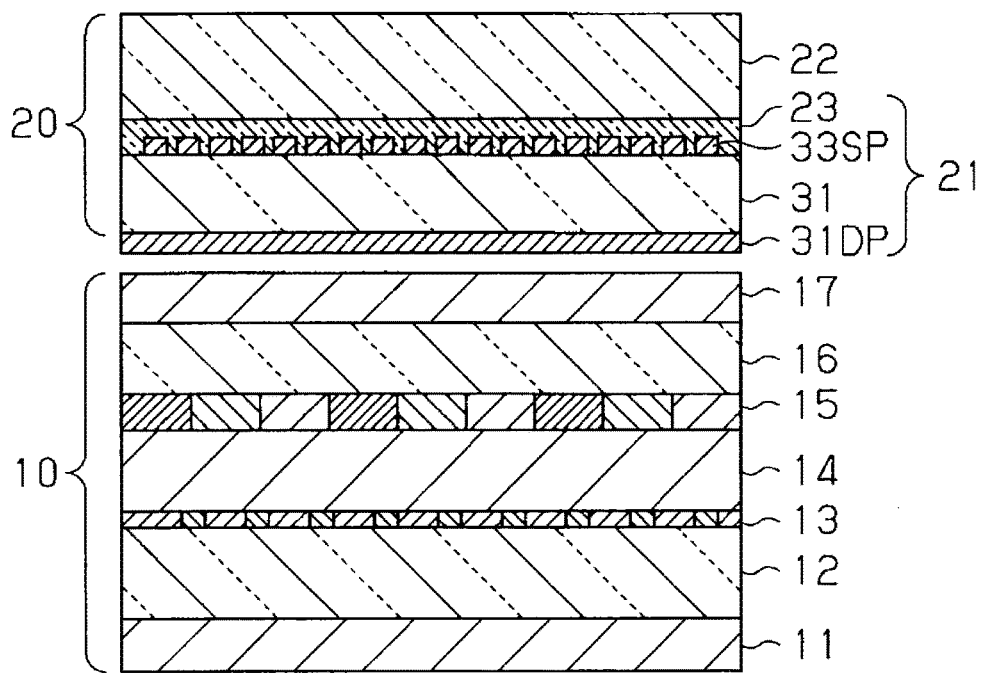
FIG. 13 is a cross-section view showing a cross-section structure of the display unit in a modification.

As shown in FIG. 13, in the electrodes 21 for a touch sensor configuring the touch panel 20, the transparent substrate 31 may be omitted. In this configuration, of the surfaces of the transparent dielectric substrate 33, one surface facing the display panel 10 is set as the drive surface 31S, and the drive electrodes 31DP are disposed on the drive surface 31S. The sensing electrodes 33SP are disposed on the other surface opposite to the drive surface 31S, of the transparent dielectric substrate 33. In this configuration, the pads 31T and the electrode wires 31L configuring the drive electrodes 31DP are formed, for example, by patterning of one thin film formed on the drive surface 31S.

Figure 14:
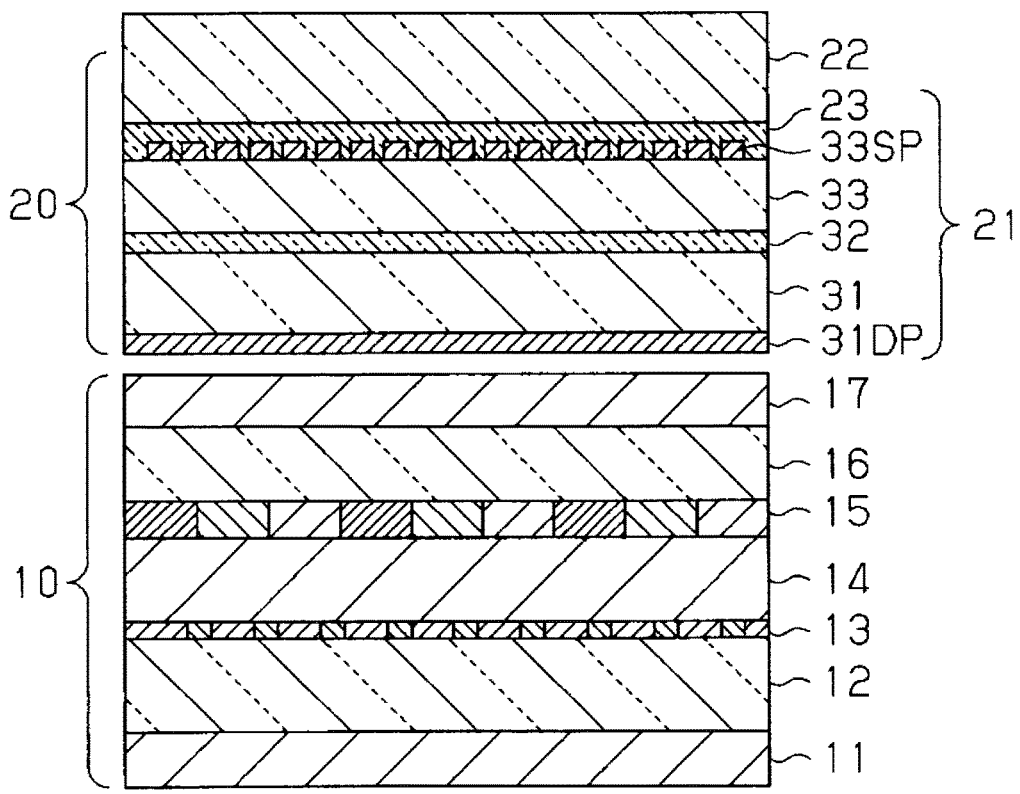
FIG. 14 is a cross-section view showing a cross-section structure of the display unit in a modification.

As shown in FIG. 14, in the touch panel 20, there may be disposed, in order from the constituent element closer to the display panel 10, the drive electrodes 31DP, the transparent substrate 31, the transparent adhesive layer 32, the transparent dielectric substrate 33, the sensing electrodes 33SP, the transparent adhesive layer 23 and the cover layer 22. In this configuration, for example, the pads 31T and the electrode wires 31L configuring the drive electrodes 31DP are formed on the drive surface 31S which is one surface of the transparent substrate 31. The pads 33T and the electrode wires 33L configuring the sensing electrodes 33SP are formed on the sensing surface 33S which is one surface of the transparent dielectric substrate 33. The surface of the transparent substrate 31 opposite to the drive surface 31S and the surface of the transparent dielectric substrate 33 opposite to the sensing surface 33S are stuck together with the transparent adhesive layer 32.

There is no need for forming the touch panel 20 and the display panel 10 separately. The touch panel 20 and the display panel 10 may be formed integrally. In this configuration, for example, of the electrodes 21 for a touch sensor, while the drive electrodes 31DP are disposed at the TFT layer 13, the sensing electrodes 33SP can be disposed between the color filter substrate 16 and the upper polarizer 17. Alternatively, the electrodes 21 for a touch sensor may be disposed between the color filter substrate 16 and the upper polarizer 17.

By the way, the electrical capacitance between the drive electrode and the sensing electrode is measured by a peripheral circuit connected to the electrodes for the touch sensor. In this case, if an initial value of the electrical capacitance is too large, a small change in electrical capacitance due to contact of the operation surface and the finger is treated as a measurement error in the peripheral circuit. Therefore, the initial value of the electrical capacitance between the electrodes needs to be appropriate value with respect to the amount of change in electrical capacitance due to the contact. This demand is satisfied generally by forming each of the plurality of electrodes into a shape and size equal to each other and arranging keeping certain spaces therebetween.

A portion selected by the finger, on the operation surface, is defined within the output range of images on the operation surface. In this case, if an area where the drive electrodes are arranged or an area where the sensing electrodes are arranged is too much smaller than the image output area, the output image includes a portion which cannot be selected by the finger. Conversely, if the area where the drive electrodes are arranged or the area where the sensing electrodes are arranged is too much larger than the image output area, measurement of the electrical capacitances between the electrodes is wastefully repeated. Accordingly, the size of the area where the electrodes are arranged needs to be the same as the output range of images. This demand is satisfied generally by matching the size of the area where the electrodes are arranged to the size of the display panel.

That is, a size of a unit area needed for arranging one electrode, such as a shape of the electrode, or size, arrangement, or the like, is defined on the basis of a standard for improving detection accuracy of the electrical capacitance. On the other hand, the size of the area where the drive electrodes are arranged or the size of the area where the sensing electrodes are arranged is determined on the basis of the size of another device other than the touch sensor. The size of the other device other than the touch sensor is ordinarily different from a whole-number multiple of the above unit area of the electrode. Accordingly, if an area where the drive electrodes are arranged or an area where the sensing electrodes are arranged is too much smaller than the output range of images, the edge of the output image does not include any electrode portion essentially needed for detecting the contact. Conversely, if the area where the drive electrodes are arranged or the area where the sensing electrodes are arranged is too much larger than the image output area, the end of the area where the electrodes are arranged includes an electrode portion which is essentially not needed as a target area of sensing.

As a result, because the size of the area needed for arranging one electrode is defined, if the drive electrodes and the sensing electrodes are arranged to cover the whole output image, a part of the electrodes is out of the image output area. In order to prevent the touch sensor from including the unnecessary part of the electrodes, if the unnecessary part of the electrodes, which is outside the output image, is omitted, resultingly the initial value of the electrical capacitance between the electrodes at the ends of the area where the electrodes are arranged becomes lower than that in other areas.

Not only the configuration where the unnecessary part of the electrodes is omitted but also deviations of relative position between the ends of the area where the electrodes are arranged and the electrodes facing them can cause the problem that the electrical capacitance at the end of the area where the electrodes are arranged is smaller than that in other areas.

The art of this disclosure has as its object the provision of electrodes for a touch sensor preventing the electrical capacitance at the end of an area where the electrodes are arranged from being lowered, and also a touch panel and a display unit.

An aspect of electrodes for a touch sensor in this disclosure has a plurality of strip electrodes arranged along an arrangement direction which is one direction, with spaces therebetween, wherein each of the strip electrodes is an aggregate of a plurality of electrode wires disposed with spaces therebetween, the plurality of strip electrodes are equal in total area of the plurality of electrode wires of each strip electrode, the plurality of strip electrodes include an end strip electrode and another strip electrode other than the end strip electrode, the end strip electrode being located at least at one end in the arrangement direction, and when a ratio of a total area of the electrode wires to an area of a respective strip electrode is defined as an area ratio in the strip electrode, the area ratio in the end strip electrode is different from the area ratio in the other strip electrode.

An aspect of a touch panel in this disclosure has the above-described electrodes for a touch sensor, and a cover layer covering the electrodes for a touch sensor, wherein the electrodes for a touch sensor have a transparent substrate, a plurality of first strip electrodes arranged on a surface of the transparent dielectric substrate along a first direction, keeping spaces therebetween, and a plurality of second strip electrodes arranged on a back surface of the transparent dielectric substrate along a second direction, keeping spaces therebetween, at least one of the first strip electrode and the second strip electrode is the strip electrode, and the touch panel further has a peripheral circuit measuring electrical capacitances between the first strip electrodes and the second strip electrodes.

An aspect of a display unit in this disclosure has a display panel displaying information, a drive circuit driving the display panel, the touch panel transmitting therethrough the information which the display panel displays.

According to an aspect in the art of this disclosure, the end strip electrode disposed at least at one end in the arrangement direction is equal to the other strip electrode in total area of the electrode wires of each strip electrode, and differs in area ratio of the total area of the electrode wires to the area of the strip electrode from the other strip electrode. Therefore, in the end strip electrode, while the area of the strip electrode itself is different from that of the other strip electrode, the electrical capacitance is prevented from being smaller than the electrical capacitance of the other strip electrode.

Obviously, numerous modifications and variations of the present invention are possible in light of the above teachings. It is therefore to be understood that within the scope of the appended claims, the invention may be practiced otherwise than as specifically described herein.

What is claimed is:

1. An electrode for a touch sensor, comprising
   a plurality of strip electrodes arranged in an arrangement direction with a space therebetween,
   wherein each of the strip electrodes is made of a group of electrode wires spaced from one another and formed such that a total area of the electrode wires in each of the strip electrodes is the same,
   the plurality of strip electrodes includes an end strip electrode and a non-end strip electrode, the end strip electrode being located in at least one end portion in the arrangement direction, and
   the plurality of strip electrodes is formed such that the end strip electrode has an area ratio different from an area ratio of the non-end strip electrode, where the area ratio of each of the strip electrodes is defined as a ratio of the total area of the electrode wires in each of the strip electrodes to an area of each of the strip electrodes.

2. The electrode according to claim 1, wherein the end strip electrode has the area ratio larger than the area ratio of the non-end strip electrode.

3. The electrode according to claim 2, wherein the end strip electrode has a first electrode portion formed such that an area of the electrode wires in a unit area in the first electrode portion is equal to an area of the electrode wires in a unit area in the non-end strip electrode, and that the electrode wires adjacent to each other in the first electrode portion are disposed at a space equal to a space of the electrode wires adjacent to each other in the non-end strip electrode.

4. The electrode according to claim 3, wherein the end strip electrode further includes a second electrode portion formed such that an area of the electrode wires in a unit area in the second electrode portion is larger than an area of the electrode wires in a unit area in the non-end strip electrode, and that the electrode wires adjacent to each other in the second electrode portion are disposed at a space narrower than a space of the electrode wires adjacent to each other in the non-end strip electrode.

5. The electrode according to claim 4, wherein the first electrode portion of the end strip electrode is located between the second electrode portion and the non-end strip electrode.

6. The electrode according to claim 3, wherein the end strip electrode further includes a second electrode portion formed such that an area of the electrode wires in a unit area in the second electrode portion is smaller than an area of the electrode wires in a unit area in the non-end strip electrode, and that the electrode wires adjacent to each other in the second electrode portion are disposed at a space wider than a space of the electrode wires adjacent to each other in the non-end strip electrode.

7. The electrode according to claim 6, further comprising:
   a pad for each of the strip electrodes,
   wherein the second electrode portion of the end strip electrode includes
   connection wires which are the electrode wires connected to the pad, and
   a non-connection wire which is not connected to the pad,
   the end strip electrode has an electrode portion where the electrode wires adjacent to each other are disposed at a space wider than a space between the electrode wires adjacent to each other in the non-end strip electrode, and the non-connection wire is disposed in the electrode portion of the end strip electrode.

8. The electrode according to claim 2, further comprising:
a transparent dielectric substrate having a surface and a back surface,
wherein the strip electrodes are arranged at least one of 1) on the surface in a first direction and 2) on the back surface in a second direction different from the first direction, and
the end strip electrode includes the electrode wires adjacent to each other disposed at a space which is at least twice of a distance between the surface and the back surface.

9. The electrode according to claim 2, wherein each of the strip electrodes includes a first electrode wire configuring the electrode wire,
the non-end strip electrode is configured by the first electrode wires, and
the end strip electrode has a second electrode wire in addition to the first electrode wire.

10. The electrode according to claim 1, wherein the end strip electrode has the area ratio smaller than the area ratio of the non-end strip electrode.

11. A touch panel, comprising:
one or more of the electrode for a touch sensor according to claim 1; and
a cover layer covering the electrode,
wherein the electrode includes a transparent dielectric substrate having a surface and a back surface,
a plurality of first strip electrodes is arranged on the surface in a first direction with a space therebetween,
a plurality of second strip electrodes is arranged on the back surface in a second direction different from the first direction with a space therebetween,
at least one of the first strip electrodes and the second strip electrodes is formed by the plurality of strip electrodes, and
the touch panel further includes a peripheral circuit configured to measure an electrical capacitance between the first strip electrodes and the second strip electrodes.

12. The touch panel according to 11, wherein the transparent dielectric substrate includes
a first substrate configured to support the first strip electrodes, and
a second substrate configured to support the second strip electrodes.

13. The touch panel according to 11, wherein the transparent dielectric substrate includes at least one of
a first substrate configured to support the first strip electrodes, and
a second substrate configured to support the second strip electrodes.

14. The touch panel according to 11, wherein the transparent dielectric substrate is made of one substrate.

15. A display unit, comprising:
a display panel configured to display information;
a drive circuit configured to drive the display panel; and
the touch panel according to claim 11 configured to transmit therethrough the information which the display panel displays.

* * * * *